United States Patent [19]

Miyanishi

[11] Patent Number: 5,629,697
[45] Date of Patent: May 13, 1997

[54] CODE CONVERSION CIRCUIT

[75] Inventor: Atushi Miyanishi, Itami, Japan

[73] Assignee: Mitsubishi Denki Kabushiki Kaisha, Tokyo, Japan

[21] Appl. No.: 115,346

[22] Filed: Sep. 1, 1993

[30] Foreign Application Priority Data

Sep. 3, 1992 [JP] Japan ................................. 4-235752

[51] Int. Cl.$^6$ .................................................. H03M 7/20
[52] U.S. Cl. ........................... 341/102; 341/50; 326/105
[58] Field of Search ................................ 341/102, 103, 341/106, 136, 155, 160, 50, 153, 144; 326/105; 365/230.06, 49

[56] References Cited

U.S. PATENT DOCUMENTS

| | | | |
|---|---|---|---|
| 3,599,182 | 8/1971 | Henle | 326/105 |
| 3,653,034 | 3/1972 | ReGitz | 341/102 |
| 4,177,455 | 12/1979 | Armstrong et al. | 341/103 |
| 4,887,084 | 12/1989 | Yamaguchi | 341/102 |
| 5,243,348 | 9/1993 | Jackson | 341/160 |

*Primary Examiner*—Howard L. Williams
*Assistant Examiner*—Peguy JeanPierre
*Attorney, Agent, or Firm*—Christopher R. Pastel; Thomas R. Morrison

[57] ABSTRACT

A code conversion circuit includes a first decoder having a number of output lines. The first decoder is responsive to an input binary signal representing a value i to develop a signal "1" on the (i+1)-th output line thereof. A second decoder is provided which includes gates connected to the respective ones of the first decoder output lines. The second decoder develops a signal "1" on all of the first to i-th output lines thereof, and a signal "0" on all of the remaining output lines. The gates of the second decoder are divided into a plurality of blocks in which gates are connected in series. Block control signals are prepared from most significant bits of the binary input signal and applied to the respective blocks. The block to which the signal "1" is applied from the first decoder so that the signals "1" and "0" are developed on appropriate ones of the output lines. The lower order blocks are conditioned to develop a signal "1" on all of the output lines thereof, and the higher order blocks are conditioned to develop a signal "0" on all of the output lines thereof.

15 Claims, 13 Drawing Sheets

| Input Value | i | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| Binary Input Signal | $L_4$ | 0 | 0 | 0 | 0 | 0 | 0 | 0 | 0 | 1 | 1 | 1 | 1 | 1 | 1 | 1 | 1 |
| | $L_3$ | 0 | 0 | 0 | 0 | 1 | 1 | 1 | 1 | 0 | 0 | 0 | 0 | 1 | 1 | 1 | 1 |
| | $L_2$ | 0 | 0 | 1 | 1 | 0 | 0 | 1 | 1 | 0 | 0 | 1 | 1 | 0 | 0 | 1 | 1 |
| | $L_1$ | 0 | 1 | 0 | 1 | 0 | 1 | 0 | 1 | 0 | 1 | 0 | 1 | 0 | 1 | 0 | 1 |
| Block Control Signal | $C_3$ | 0 | 0 | 0 | 0 | 0 | 0 | 0 | 0 | 0 | 0 | 0 | 0 | 1 | 1 | 1 | 1 |
| | $C_2$ | 0 | 0 | 0 | 0 | 0 | 0 | 0 | 0 | 1 | 1 | 1 | 1 | 1 | 1 | 1 | 1 |
| | $C_1$ | 0 | 0 | 0 | 0 | 1 | 1 | 1 | 1 | 1 | 1 | 1 | 1 | 1 | 1 | 1 | 1 |
| Outputs of Decoder 1 | $Z_{16}$ | 0 | 0 | 0 | 0 | 0 | 0 | 0 | 0 | 0 | 0 | 0 | 0 | 0 | 0 | 0 | 1 |
| | $Z_{15}$ | 0 | 0 | 0 | 0 | 0 | 0 | 0 | 0 | 0 | 0 | 0 | 0 | 0 | 0 | 1 | 0 |
| | $Z_{14}$ | 0 | 0 | 0 | 0 | 0 | 0 | 0 | 0 | 0 | 0 | 0 | 0 | 0 | 1 | 0 | 0 |
| | $Z_{13}$ | 0 | 0 | 0 | 0 | 0 | 0 | 0 | 0 | 0 | 0 | 0 | 0 | 1 | 0 | 0 | 0 |
| | $Z_{12}$ | 0 | 0 | 0 | 0 | 0 | 0 | 0 | 0 | 0 | 0 | 0 | 1 | 0 | 0 | 0 | 0 |
| | $Z_{11}$ | 0 | 0 | 0 | 0 | 0 | 0 | 0 | 0 | 0 | 0 | 1 | 0 | 0 | 0 | 0 | 0 |
| | $Z_{10}$ | 0 | 0 | 0 | 0 | 0 | 0 | 0 | 0 | 0 | 1 | 0 | 0 | 0 | 0 | 0 | 0 |
| | $Z_9$ | 0 | 0 | 0 | 0 | 0 | 0 | 0 | 0 | 1 | 0 | 0 | 0 | 0 | 0 | 0 | 0 |
| | $Z_8$ | 0 | 0 | 0 | 0 | 0 | 0 | 0 | 1 | 0 | 0 | 0 | 0 | 0 | 0 | 0 | 0 |
| | $Z_7$ | 0 | 0 | 0 | 0 | 0 | 0 | 1 | 0 | 0 | 0 | 0 | 0 | 0 | 0 | 0 | 0 |
| | $Z_6$ | 0 | 0 | 0 | 0 | 0 | 1 | 0 | 0 | 0 | 0 | 0 | 0 | 0 | 0 | 0 | 0 |
| | $Z_5$ | 0 | 0 | 0 | 0 | 1 | 0 | 0 | 0 | 0 | 0 | 0 | 0 | 0 | 0 | 0 | 0 |
| | $Z_4$ | 0 | 0 | 0 | 1 | 0 | 0 | 0 | 0 | 0 | 0 | 0 | 0 | 0 | 0 | 0 | 0 |
| | $Z_3$ | 0 | 0 | 1 | 0 | 0 | 0 | 0 | 0 | 0 | 0 | 0 | 0 | 0 | 0 | 0 | 0 |
| | $Z_2$ | 0 | 1 | 0 | 0 | 0 | 0 | 0 | 0 | 0 | 0 | 0 | 0 | 0 | 0 | 0 | 0 |
| | $Z_1$ | 1 | 0 | 0 | 0 | 0 | 0 | 0 | 0 | 0 | 0 | 0 | 0 | 0 | 0 | 0 | 0 |
| Outputs of Decoder 2 | $Y_{15}$ | 0 | 0 | 0 | 0 | 0 | 0 | 0 | 0 | 0 | 0 | 0 | 0 | 0 | 0 | 0 | 1 |
| | $Y_{14}$ | 0 | 0 | 0 | 0 | 0 | 0 | 0 | 0 | 0 | 0 | 0 | 0 | 0 | 0 | 1 | 1 |
| | $Y_{13}$ | 0 | 0 | 0 | 0 | 0 | 0 | 0 | 0 | 0 | 0 | 0 | 0 | 0 | 1 | 1 | 1 |
| | $Y_{12}$ | 0 | 0 | 0 | 0 | 0 | 0 | 0 | 0 | 0 | 0 | 0 | 0 | 1 | 1 | 1 | 1 |
| | $Y_{11}$ | 0 | 0 | 0 | 0 | 0 | 0 | 0 | 0 | 0 | 0 | 0 | 1 | 1 | 1 | 1 | 1 |
| | $Y_{10}$ | 0 | 0 | 0 | 0 | 0 | 0 | 0 | 0 | 0 | 0 | 1 | 1 | 1 | 1 | 1 | 1 |
| | $Y_9$ | 0 | 0 | 0 | 0 | 0 | 0 | 0 | 0 | 0 | 1 | 1 | 1 | 1 | 1 | 1 | 1 |
| | $Y_8$ | 0 | 0 | 0 | 0 | 0 | 0 | 0 | 0 | 1 | 1 | 1 | 1 | 1 | 1 | 1 | 1 |
| | $Y_7$ | 0 | 0 | 0 | 0 | 0 | 0 | 0 | 1 | 1 | 1 | 1 | 1 | 1 | 1 | 1 | 1 |
| | $Y_6$ | 0 | 0 | 0 | 0 | 0 | 0 | 1 | 1 | 1 | 1 | 1 | 1 | 1 | 1 | 1 | 1 |
| | $Y_5$ | 0 | 0 | 0 | 0 | 0 | 1 | 1 | 1 | 1 | 1 | 1 | 1 | 1 | 1 | 1 | 1 |
| | $Y_4$ | 0 | 0 | 0 | 0 | 1 | 1 | 1 | 1 | 1 | 1 | 1 | 1 | 1 | 1 | 1 | 1 |
| | $Y_3$ | 0 | 0 | 0 | 1 | 1 | 1 | 1 | 1 | 1 | 1 | 1 | 1 | 1 | 1 | 1 | 1 |
| | $Y_2$ | 0 | 0 | 1 | 1 | 1 | 1 | 1 | 1 | 1 | 1 | 1 | 1 | 1 | 1 | 1 | 1 |
| | $Y_1$ | 0 | 1 | 1 | 1 | 1 | 1 | 1 | 1 | 1 | 1 | 1 | 1 | 1 | 1 | 1 | 1 |

FIG. 1   TABLE 1

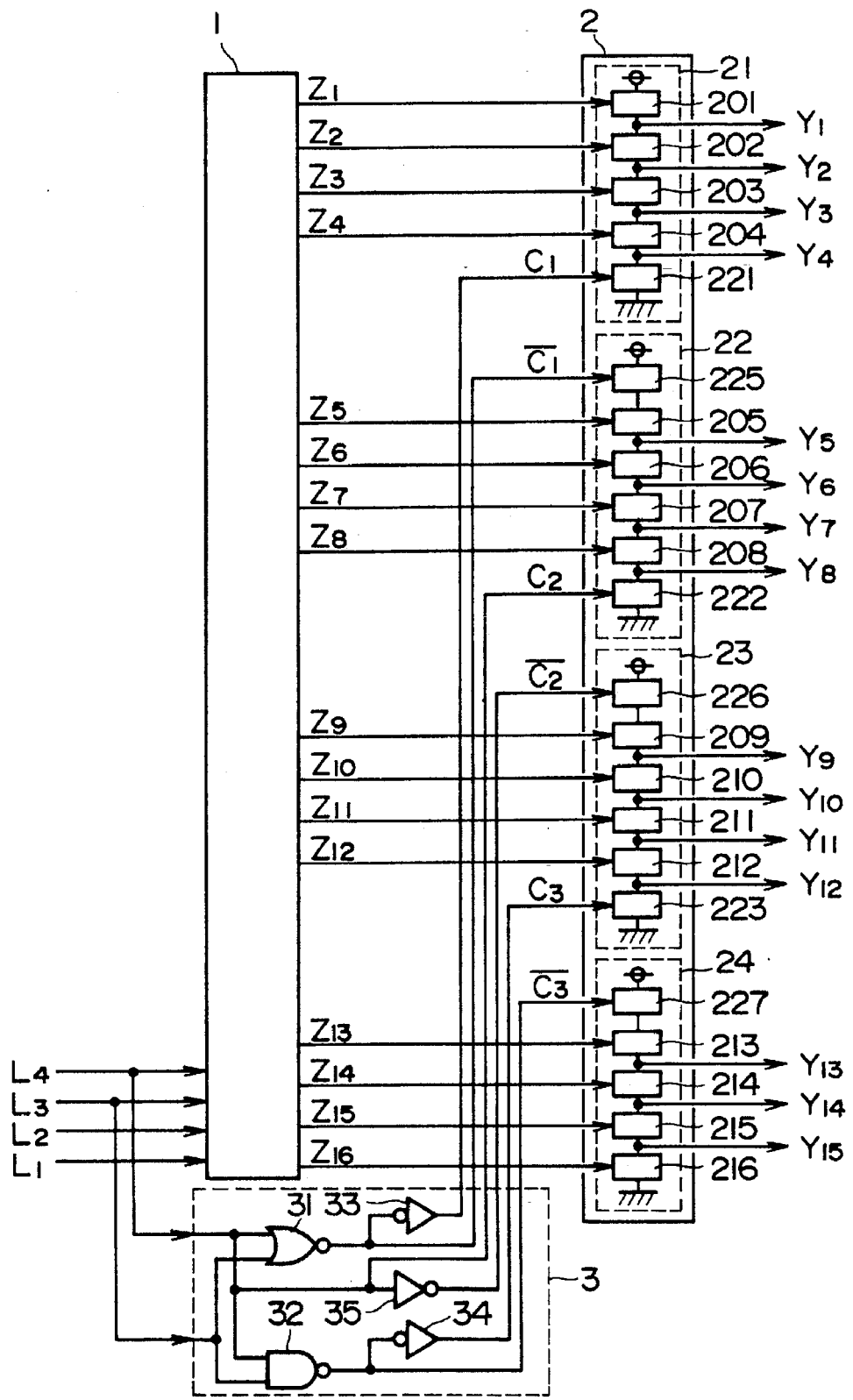
F I G . 4

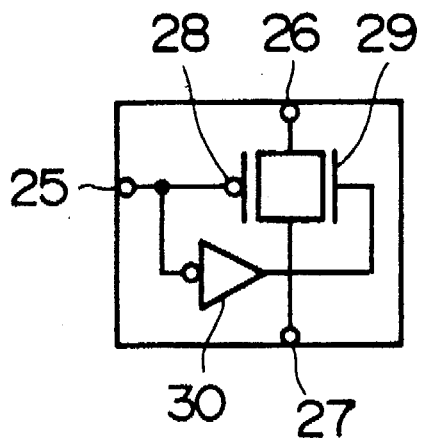
F I G. 5 (a)
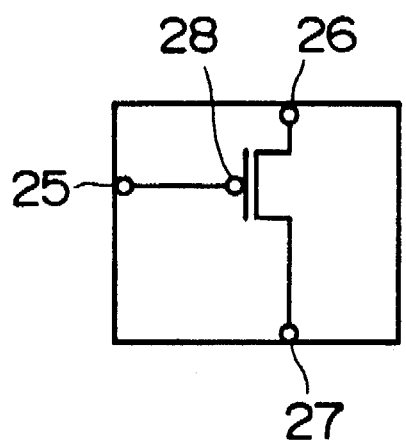
F I G. 5 (b)
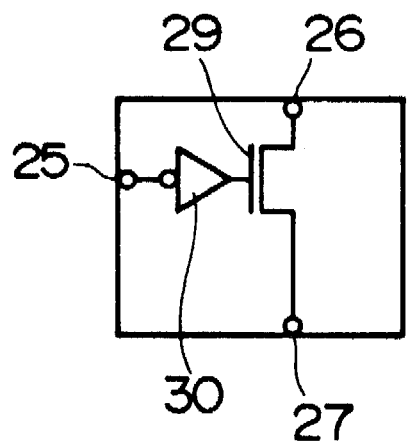
F I G. 5 (c)

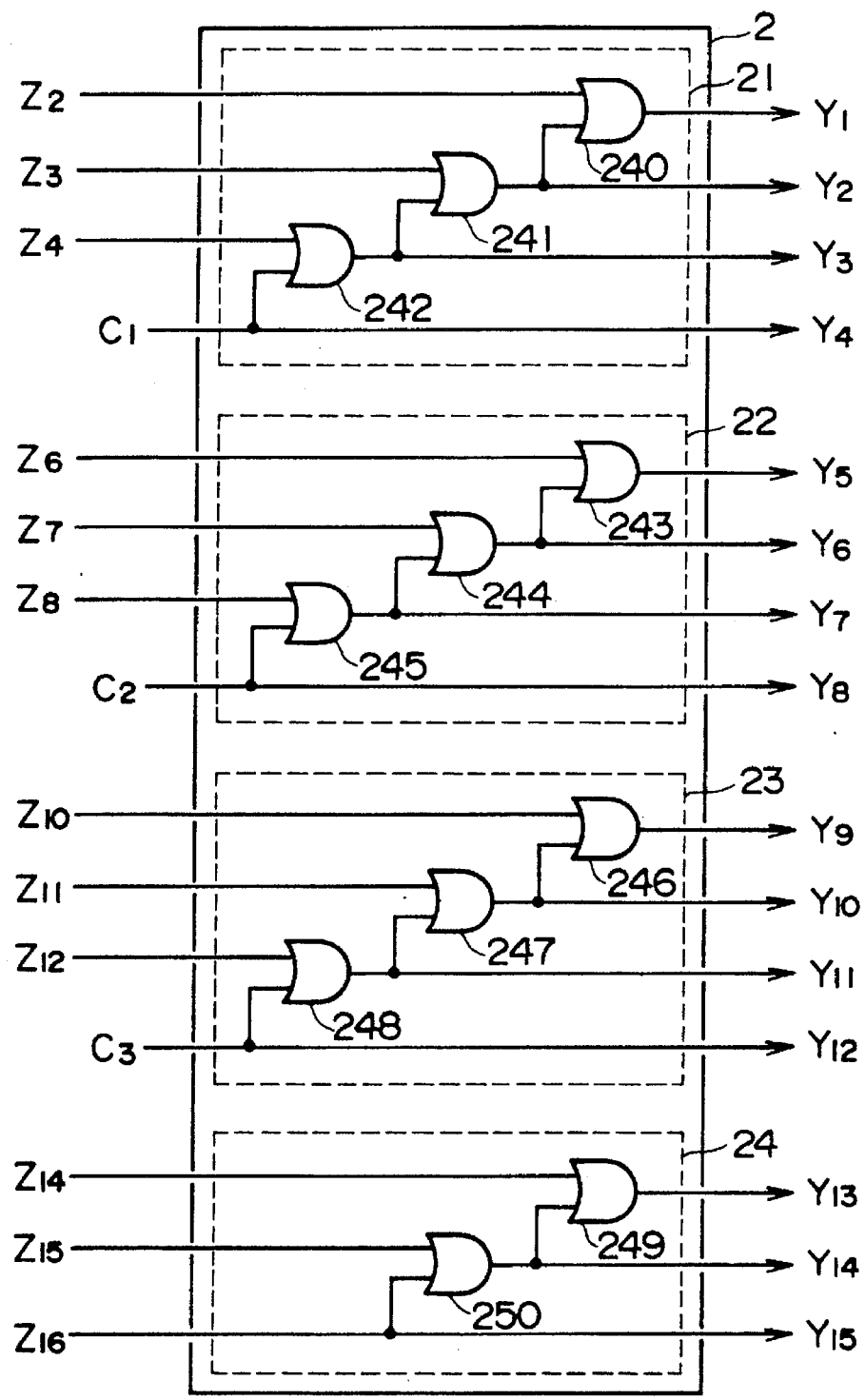
F I G. 7

| Input Value | i | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| Binary Input Signal | $L_4$ | 0 | 0 | 0 | 0 | 0 | 0 | 0 | 0 | 1 | 1 | 1 | 1 | 1 | 1 | 1 | 1 |
| | $L_3$ | 0 | 0 | 0 | 0 | 1 | 1 | 1 | 1 | 0 | 0 | 0 | 0 | 1 | 1 | 1 | 1 |
| | $L_2$ | 0 | 0 | 1 | 1 | 0 | 0 | 1 | 1 | 0 | 0 | 1 | 1 | 0 | 0 | 1 | 1 |
| | $L_1$ | 0 | 1 | 0 | 1 | 0 | 1 | 0 | 1 | 0 | 1 | 0 | 1 | 0 | 1 | 0 | 1 |
| Block Control Signal | $C_3$ | 0 | 0 | 0 | 0 | 0 | 0 | 0 | 0 | 0 | 0 | 0 | 0 | 1 | 1 | 1 | 1 |
| | $C_2$ | 0 | 0 | 0 | 0 | 0 | 0 | 0 | 0 | 1 | 1 | 1 | 1 | 1 | 1 | 1 | 1 |
| | $C_1$ | 0 | 0 | 0 | 0 | 1 | 1 | 1 | 1 | 1 | 1 | 1 | 1 | 1 | 1 | 1 | 1 |
| Outputs of Decoder 1 | $Z_{16}$ | 0 | 0 | 0 | 0 | 0 | 0 | 0 | 0 | 0 | 0 | 0 | 0 | 0 | 0 | 0 | 1 |
| | $Z_{15}$ | 0 | 0 | 0 | 0 | 0 | 0 | 0 | 0 | 0 | 0 | 0 | 0 | 0 | 0 | 1 | 0 |
| | $Z_{14}$ | 0 | 0 | 0 | 0 | 0 | 0 | 0 | 0 | 0 | 0 | 0 | 0 | 0 | 1 | 0 | 0 |
| | $Z_{13}$ | 0 | 0 | 0 | 0 | 0 | 0 | 0 | 0 | 0 | 0 | 0 | 0 | 1 | 0 | 0 | 0 |
| | $Z_{12}$ | 0 | 0 | 0 | 0 | 0 | 0 | 0 | 0 | 0 | 0 | 0 | 1 | 0 | 0 | 0 | 0 |
| | $Z_{11}$ | 0 | 0 | 0 | 0 | 0 | 0 | 0 | 0 | 0 | 0 | 1 | 0 | 0 | 0 | 0 | 0 |
| | $Z_{10}$ | 0 | 0 | 0 | 0 | 0 | 0 | 0 | 0 | 0 | 1 | 0 | 0 | 0 | 0 | 0 | 0 |
| | $Z_9$ | 0 | 0 | 0 | 0 | 0 | 0 | 0 | 0 | 1 | 0 | 0 | 0 | 0 | 0 | 0 | 0 |
| | $Z_8$ | 0 | 0 | 0 | 0 | 0 | 0 | 0 | 1 | 0 | 0 | 0 | 0 | 0 | 0 | 0 | 0 |
| | $Z_7$ | 0 | 0 | 0 | 0 | 0 | 0 | 1 | 0 | 0 | 0 | 0 | 0 | 0 | 0 | 0 | 0 |
| | $Z_6$ | 0 | 0 | 0 | 0 | 0 | 1 | 0 | 0 | 0 | 0 | 0 | 0 | 0 | 0 | 0 | 0 |
| | $Z_5$ | 0 | 0 | 0 | 0 | 1 | 0 | 0 | 0 | 0 | 0 | 0 | 0 | 0 | 0 | 0 | 0 |
| | $Z_4$ | 0 | 0 | 0 | 1 | 0 | 0 | 0 | 0 | 0 | 0 | 0 | 0 | 0 | 0 | 0 | 0 |
| | $Z_3$ | 0 | 0 | 1 | 0 | 0 | 0 | 0 | 0 | 0 | 0 | 0 | 0 | 0 | 0 | 0 | 0 |
| | $Z_2$ | 0 | 1 | 0 | 0 | 0 | 0 | 0 | 0 | 0 | 0 | 0 | 0 | 0 | 0 | 0 | 0 |
| | $Z_1$ | 1 | 0 | 0 | 0 | 0 | 0 | 0 | 0 | 0 | 0 | 0 | 0 | 0 | 0 | 0 | 0 |
| Outputs of Decoder 2 | $Y_{15}$ | 0 | 1 | 1 | 1 | 1 | 1 | 1 | 1 | 1 | 1 | 1 | 1 | 1 | 1 | 1 | 1 |
| | $Y_{14}$ | 0 | 0 | 1 | 1 | 1 | 1 | 1 | 1 | 1 | 1 | 1 | 1 | 1 | 1 | 1 | 1 |
| | $Y_{13}$ | 0 | 0 | 0 | 1 | 1 | 1 | 1 | 1 | 1 | 1 | 1 | 1 | 1 | 1 | 1 | 1 |
| | $Y_{12}$ | 0 | 0 | 0 | 0 | 1 | 1 | 1 | 1 | 1 | 1 | 1 | 1 | 1 | 1 | 1 | 1 |
| | $Y_{11}$ | 0 | 0 | 0 | 0 | 0 | 1 | 1 | 1 | 1 | 1 | 1 | 1 | 1 | 1 | 1 | 1 |
| | $Y_{10}$ | 0 | 0 | 0 | 0 | 0 | 0 | 1 | 1 | 1 | 1 | 1 | 1 | 1 | 1 | 1 | 1 |
| | $Y_9$ | 0 | 0 | 0 | 0 | 0 | 0 | 0 | 1 | 1 | 1 | 1 | 1 | 1 | 1 | 1 | 1 |
| | $Y_8$ | 0 | 0 | 0 | 0 | 0 | 0 | 0 | 0 | 1 | 1 | 1 | 1 | 1 | 1 | 1 | 1 |
| | $Y_7$ | 0 | 0 | 0 | 0 | 0 | 0 | 0 | 0 | 0 | 1 | 1 | 1 | 1 | 1 | 1 | 1 |
| | $Y_6$ | 0 | 0 | 0 | 0 | 0 | 0 | 0 | 0 | 0 | 0 | 1 | 1 | 1 | 1 | 1 | 1 |
| | $Y_5$ | 0 | 0 | 0 | 0 | 0 | 0 | 0 | 0 | 0 | 0 | 0 | 1 | 1 | 1 | 1 | 1 |
| | $Y_4$ | 0 | 0 | 0 | 0 | 0 | 0 | 0 | 0 | 0 | 0 | 0 | 0 | 1 | 1 | 1 | 1 |
| | $Y_3$ | 0 | 0 | 0 | 0 | 0 | 0 | 0 | 0 | 0 | 0 | 0 | 0 | 0 | 1 | 1 | 1 |
| | $Y_2$ | 0 | 0 | 0 | 0 | 0 | 0 | 0 | 0 | 0 | 0 | 0 | 0 | 0 | 0 | 1 | 1 |
| | $Y_1$ | 0 | 0 | 0 | 0 | 0 | 0 | 0 | 0 | 0 | 0 | 0 | 0 | 0 | 0 | 0 | 1 |

FIG. 10  TABLE 2

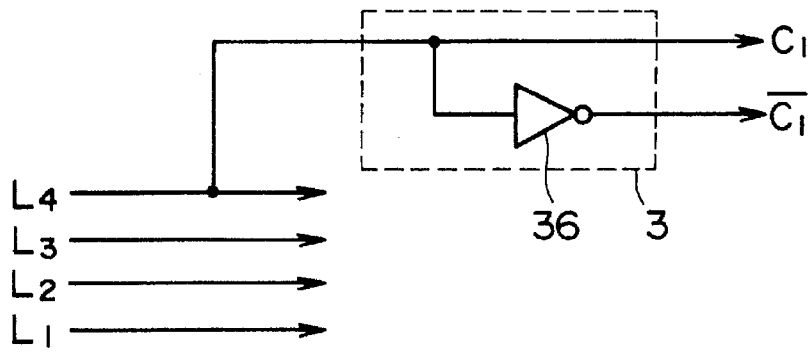
F I G. 11
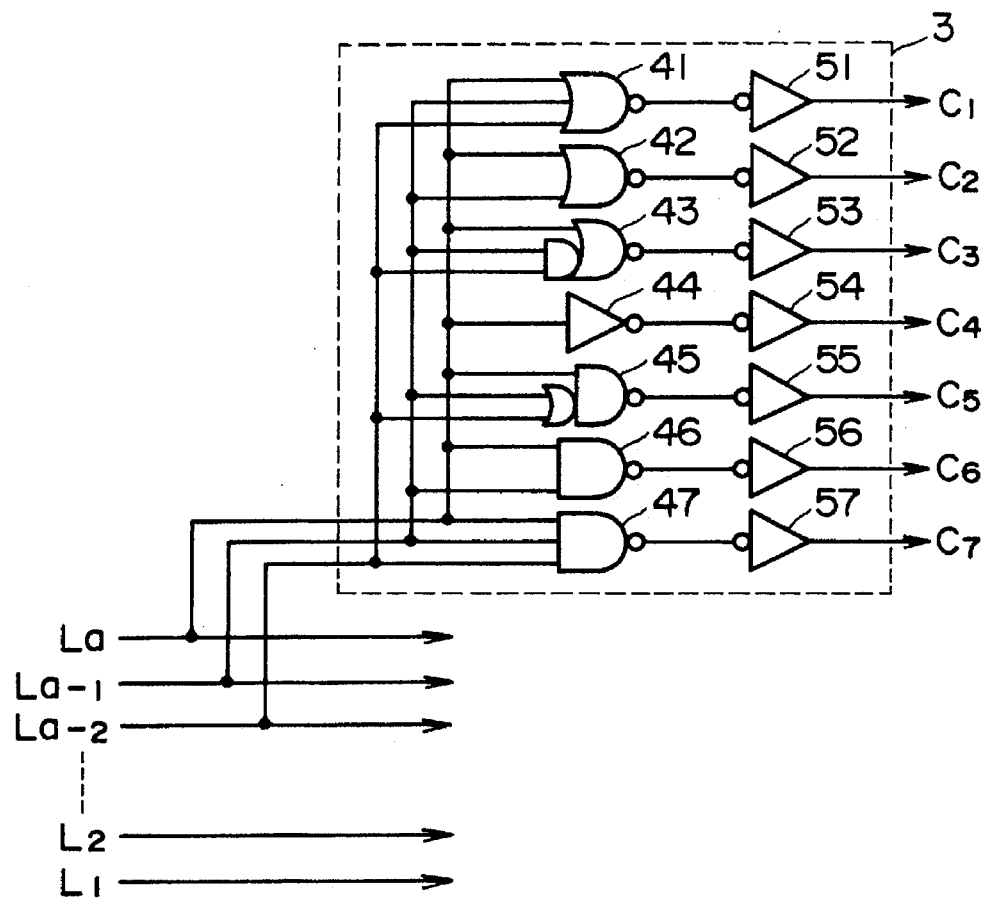
F I G. 12

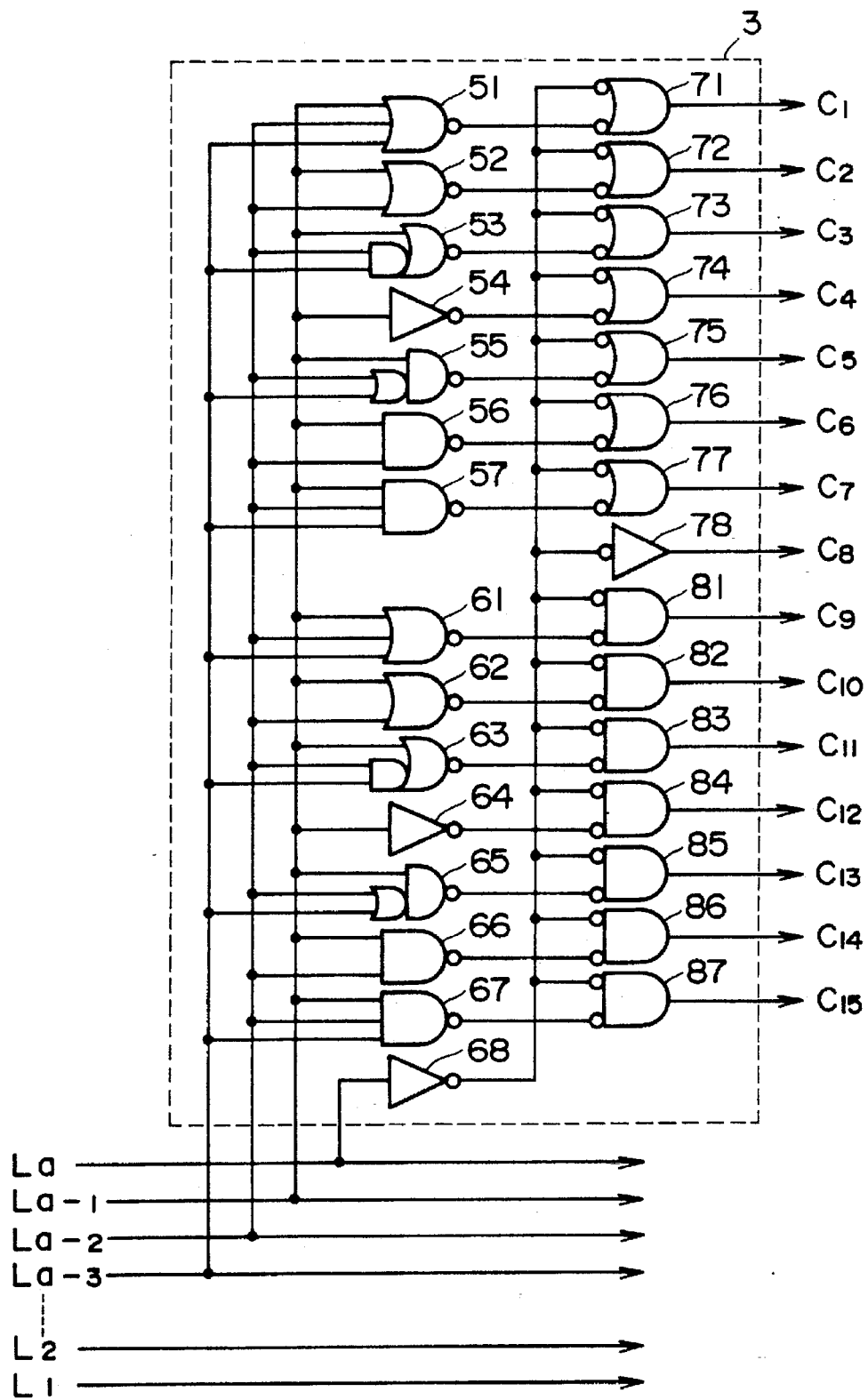
F I G. 13

CODE CONVERSION CIRCUIT

The present invention relates to a code conversion circuit which, when a value i in a binary code form is applied, provides an output "1" on all of the first to the i-th ones of a plurality of output lines and an output "0" on all of the remaining (i+1)-th to the highest order output lines, or provides "1" on i most significant output lines and "0" on all of the remaining output lines. The value i is 0 or any positive integer.

BACKGROUND OF THE INVENTION

Typically, the code conversion of the type stated above is carried out by means of two decoders. When a binary code representing the value i is applied, a first decoder develops a signal "1" only on the (i+1)-th one of a plurality of output lines thereof, and develops a signal "0" on all of the remaining output lines. The second of the two decoders receives outputs of the first decoder and develops the signal "1" on all of the first to the i-th ones of a plurality of output lines thereof and the signal "0" on all of the remaining output lines. Alternatively, the second decoder receives output signals from the first decoder and develops the signal "1" on all of the i most significant output lines and the signal "0" on all of the remaining output lines.

An example of a circuit which may be used as the second decoder is disclosed in of Japanese Unexamined Patent Publication No. SHO 63-156427. The circuit of this publication is called an decoding circuit" and includes a number of gates serially connected between a voltage supply and a point of reference potential. Respective outputs from a first decoder are coupled to corresponding gates of the second decoder. Output lines are derived from respective junctions between adjacent ones of the gates.

The second decoder of the above-described type requires a large number of transmission gates for handling a large value. For example, for a value i in a range of from 0 to 30, thirty (30) transmission gates must be connected in series, causing an increase in capacitance provided by diffusion layers of transistors constituting the gates as well as an increase in capacitance and resistance associated with wiring for the transistors. This could cause instability in circuit performance or reduce operating speed.

Another type of conventional circuit which may be used as the second decoder includes a number of OR gates connected in series, as shown in prior art FIG. 3. Respective first decoder outputs are coupled to the respective ones of the OR gates. The output of the second decoder is derived from the respective OR gates. In this type of decoder, when an input signal "1" is applied to a more significant OR gate, the signal must cause less significant OR gates successively to be enabled, which results in significant delay in operation.

Accordingly, a major object of the present invention is to provide a second decoder which can operate stably and at a high speed.

SUMMARY OF THE INVENTION

According to a first embodiment of the present invention, a code conversion circuit includes a first decoder which is responsive to an a-bit binary input representing a value i to develop a signal "1" only on the (i+1)-th one of b output lines thereof and develop a signal "0" on all of the remaining output lines, where i is an integer and b is equal to or smaller than $2^a$. The code conversion circuit further includes a second decoder which is responsive to the output signals of the first decoder to develop the signal "1" on all of the first to i-th ones of j ordinally numbered output lines thereof and develop the signal "0" on all of the remaining (i+1)-th to the j-th output lines. The number j can be equal to or less than (b−1).

According to the first embodiment of the present invention, the second decoder is segmented into a plurality of blocks each having ordinally numbered ones of output lines. Each block also includes block control means. The block control means controls the state of the block to which the block control means belongs. The block may be placed in a first state in which a signal "1" is developed on all of the output lines of that block, a second state in which the signal "1" is developed on the i-th one of all of the output lines of the second decoder and also on lower order ones of the output lines which belong to that block, if that block includes the i-th output line and a signal "0" is developed on all of the remaining output lines of that block, or a third state in which the signal "0" is developed on all of the output lines of that block.

Segmentation control signal generating means is provided, which prepares block control signals in accordance with the binary input to the first decoder, for controlling the block control means of the respective blocks such that the n-th block which includes the i-th output line assumes the second state, the first to the (n−1)-th blocks assume the first state, and all of the remaining blocks above in the order the (n+1)-th block assume the third state.

A code conversion circuit according to a second embodiment of the invention includes a first decoder similar to the one described above. A second decoder includes j ordinally numbered output lines and is responsive to the output signals of the first decoder to develop the signal "1" on all of the i most significant ones of the j output lines thereof, and develop the signal "0" on all of the remaining output lines. The number j can be equal to or smaller than (b−1).

According to the second embodiment of the present invention, the second decoder is segmented into a plurality of blocks each having ordinally numbered ones of output lines. Each block also includes block control means. The block control means controls the block to which the block control means belongs. The block may be placed in a first state in which the signal "1" is developed on all of the output lines of that block, a second state in which the signal "1" is developed on the (j-i+1) output line of all the output lines of the second decoder and on higher order output lines of that block and a signal "0" is developed on all of the remaining output lines of that block when the (j-i+1)-th output line belongs to that block, or a third state in which the signal "0" is developed on all of the output lines of that block.

Segmentation control signal generating means is provided, which prepares block control signals in accordance with the binary input to the first decoder, for controlling the block control means of the respective blocks such that the n-th block which includes the (j-i+1)-th output line assumes the second state, the first to the (n−1)-th blocks assume the first state, and all of the remaining blocks above in the order the n+1)-th block assume the third state.

It is advantageous to divide the second decoder into a power of 2. Assuming that the number of blocks is $2^c$, the block control signal generating means can prepare block control signals based on the c most significant bits of the a-bit input binary code signal.

For example, when a 4-bit binary code is applied as an input, the second decoder may be segmented into two blocks so that the most significant bit of the 4-bit binary input can be used to prepare the block control signals. If the second decoder is segmented into four blocks, the two most significant bits of the binary input may be used to prepare the block control signals.

When a binary code representing a value i is applied to the code conversion circuit of the present invention, the first decoder develops the signal "1" only on the (i+1)-th one of the output lines thereof, which is applied to the (i+1)-th input line to second decoder. The block control signal generating means prepares block control signals based on a most significant bit of the input binary code. The block control signals are applied to the block control means of the respective blocks of the second decoder.

In the code conversion circuit according to the above-described first embodiment, only the n-th block of the second decoder that includes the i-th one of the output lines of the second decoder operates, in response to the block control signals, to develop the signal "1" on the i-th one of the output lines of the second decoder and lower order output lines belonging to the n-th block and develop the signal "0" on the (i+1)-th one of the output lines of the second decoder and higher order output lines of the n-th block. All of the (n−1)-th and lower order blocks, having output lines lower in order than the i-th output line are forced to develop the signal "1" on all of their output lines, whereas all of the (n+1)-th and higher order blocks, having output lines higher in order than the i-th output line are forced to develop the signal "0" on all of their output lines. This operation is performed in response to the block control signals applied to the respective blocks.

In the code conversion circuit according to the above-described second embodiment, only the n-th block that includes the output line (i−1)-th from the most significant bit output lines (i.e. the (j-i+1)-th output line) of the second decoder operates, in response to the block control signal applied to to develop the signal "1" on the output line (i−1)-th from the most significant bit output line of the second decoder and higher order output lines belonging to the n-th block and develop the signal "0" on the output line i-th from the most significant bit output line of the second decoder and on lower order output lines belonging to the n-th block. All of the (n+1)-th and higher order blocks are forced to develop the signal "1" on all of their output lines, whereas all of the (n−1)-th and lower order blocks are forced to develop the signal "0" on all of their output lines. This operation is performed in response to the block control signals applied to the respective blocks.

BRIEF DESCRIPTION OF THE DRAWINGS

FIG. 1 is a table illustrating the code conversion performed by a code conversion circuit according to a first embodiment of the present invention, which exemplifies 4-bit binary inputs representative of values of from 0 to 15, block control signals applied to a second decoder, outputs of a first decoder, and outputs of the second decoder, corresponding to the respective 4-bit binary inputs;

FIG. 4 shows a first example of code conversion circuit according to an embodiment of the present invention, in which the second decoder is segmented into four blocks each employing serially connected transmission gates;

FIG. 5(a) shows one form of a transmission gate which may be used in the FIG. 4 decoder. FIG., 5(b) shows another form of a transmission gate which may be used in the FIG. 4 decoder. FIG. 5(c) shows another form of a transmission gate which may be used in the FIG. 4 decoder.

FIG. 7 shows a second decoder used in a third example of code conversion circuit according to an embodiment of the present invention, in which the second decoder is segmented into blocks each employing serially connected OR gates;

FIG. 10 is a table illustrating the code conversion performed by the code conversion circuit of FIG. 9;

FIG. 11 shows an example of block control signal generating circuit for segmenting the second decoder into two blocks;

FIG. 12 shows an example of block control signal generating circuit for segmenting the second decoder into eight blocks; and FIG. 13 shows an example of block control signal generating circuit for segmenting the second decoder into sixteen blocks.

DETAILED DESCRIPTION OF PREFERRED EMBODIMENTS

Referring to FIG. 4, the code conversion circuit according to an embodiment of the present invention, receives a binary input signal comprising, for example, four bits $L_1$, $L_2$, $L_3$ and $L_4$, representing a value from 0 to 15. A decoder 1 in this example has sixteen (16) output lines $Z_1$ through $Z_{16}$. Output signals on output lines $Z_1$ through $Z_{16}$ are applied to a second decoder 2 having fifteen (15) output lines $Y_1$ through $Y_{15}$. Decoder 2 in turn, develops output signals on its output lines $Y_1$ through $Y_{15}$. For example, when the input value is 6, the binary input signal is "0110" Decoder 1 receives this binary input "0110" and develops a signal "1" only on output line $Z_7$, and decoder 2 develops the signal "1" on output lines $Y_1$ through $Y_6$.

Figure 2:
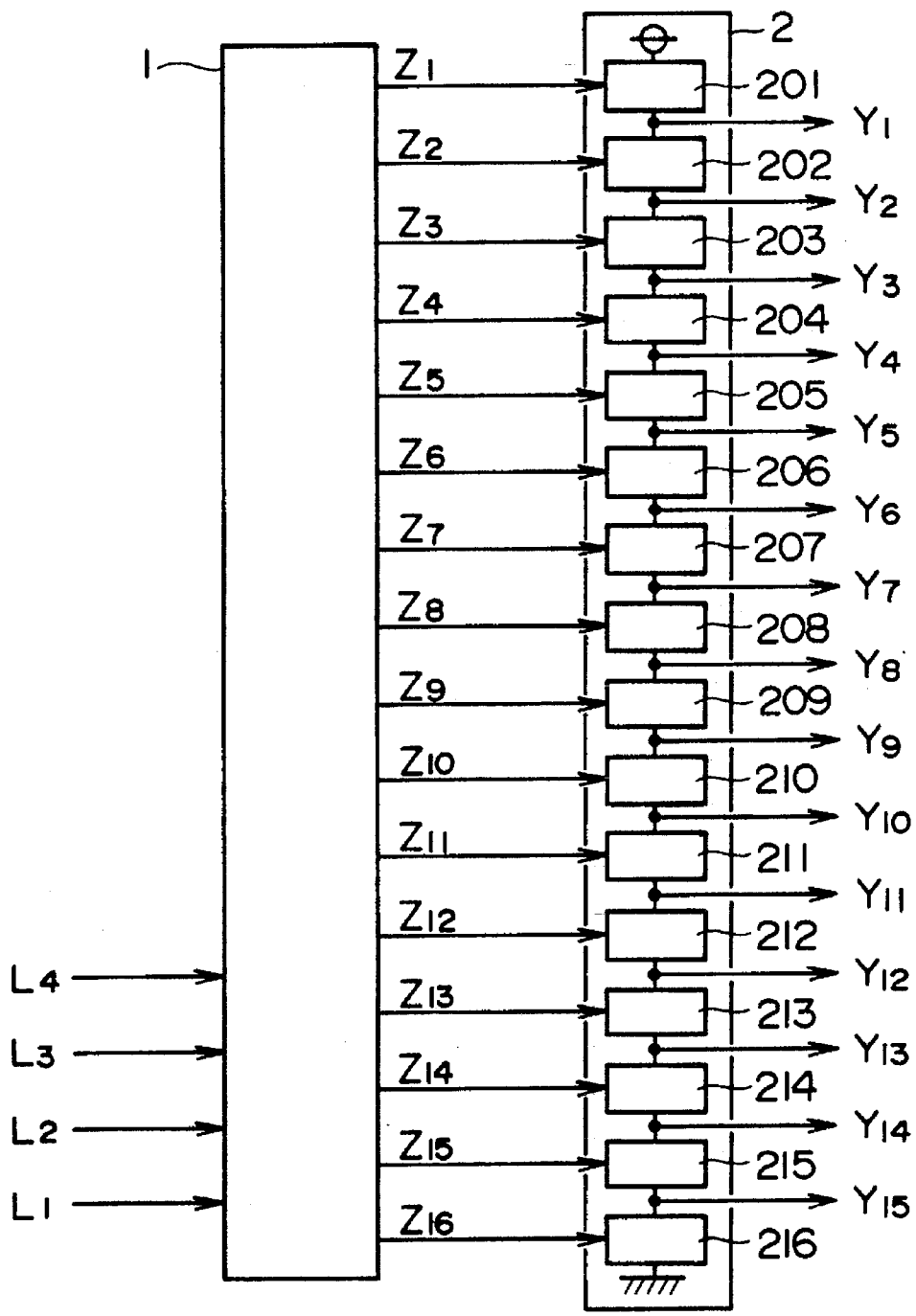
FIG. 2 shows a conventional code conversion circuit which performs code conversion similar to the code conversion provided by the circuit according to the first embodiment of the present invention, in which the second decoder comprises a number of gates connected in series.

Such code conversion has been conventionally performed by a circuit, for example as shown in FIG. 2. In FIG. 2, decoder 1 is supplied with a binary input signal through 4-bit lines $L_1$, $L_2$, $L_3$ and $L_4$ and develops an output signal "1" on an appropriate one of sixteen-bit output lines $Z_1$ through $Z_{16}$. Decoder 2 is supplied with outputs on output lines $Z_1$ through $Z_{16}$ of decoder 1 and develops output signals on fifteen-bit output lines $Y_1$ through $Y_6$ when the input value i is 6. Output signals on output lines $Y_1$ through $Y_6$ of decoder 2 and binary input signals applied to decoder 1 are related as shown in TABLE 1 shown in FIG. 1.

Figure 14:
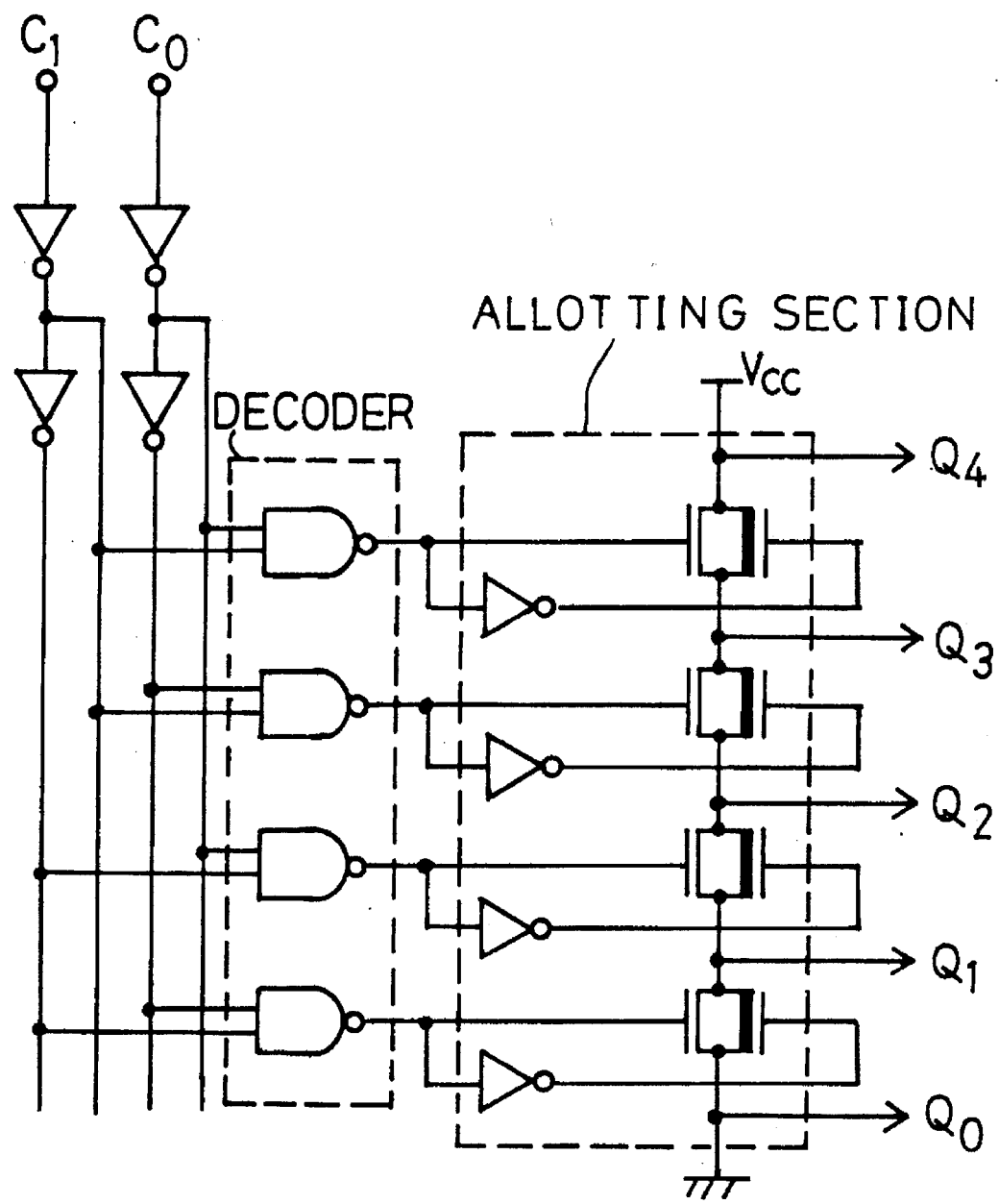
FIG. 14 shows a conventional decoder circuit shown in Japanese Unexamined Patent Publication No. SHO 63-156427.

In the conventional circuit shown in FIG. 2, decoder 2 comprises 16 transmission gates 201–216 connected in series between a voltage source and ground. Output signals of decoder 1 are applied to associated ones of the transmission gates of decoder 2. Outputs from decoder 2 are derived from junctions between respective adjacent gates. The operation and configuration of decoder 2 are similar to those of allotting section 2 of the circuit disclosed in the previously referred Japanese Unexamined Patent Publication No. SHO 63-156427. This circuit is shown in FIG. 14 of the present invention. Specifically, the allotting section of this Japanese patent publication has an equivalent function to decoder 2 of the present invention, and includes transmission gates each including a P-channel FET, an N-channel FET, and an inverter, as shown in FIG. 14. In FIG. 2 of the present application, a block represents this transmission gate. Furthermore, the circuit shown in FIG. 14 uses only four such transmission gates, in contrast with sixteen gates used in the arrangement of FIG. 2.

The operation of the circuit shown in FIG. 2 is specifically described. Let it be assumed that a value 6 is applied to the circuit. The input to decoder 1 is $L_1$="0", $L_2$="1", $L_3$="1", $L_4$="0", and the output signals bn the output lines of decoder 1 are all "0" except output line $Z_7$, as shown in FIG. 1. A signal "1" is developed only on output line $Z_7$. Gates 201–216 are rendered conductive when they are supplied with an input "0", and are rendered nonconductive when an input "1" is applied to them. Accordingly, in this particular example, only gate 207 becomes nonconductive due to the output signal "1" on output line $Z_7$ connected to gate 207. As a result, a signal "1" is developed on output line $Y_8$ and on all of output lines $Y_5, Y_4, Y_3, Y_2$ and $Y_1$ closer to the voltage source than output line $Y_6$. A signal "0" is developed on all of output lines $Y_7$ through $Y_{15}$ which are closer to ground.

Figure 3:
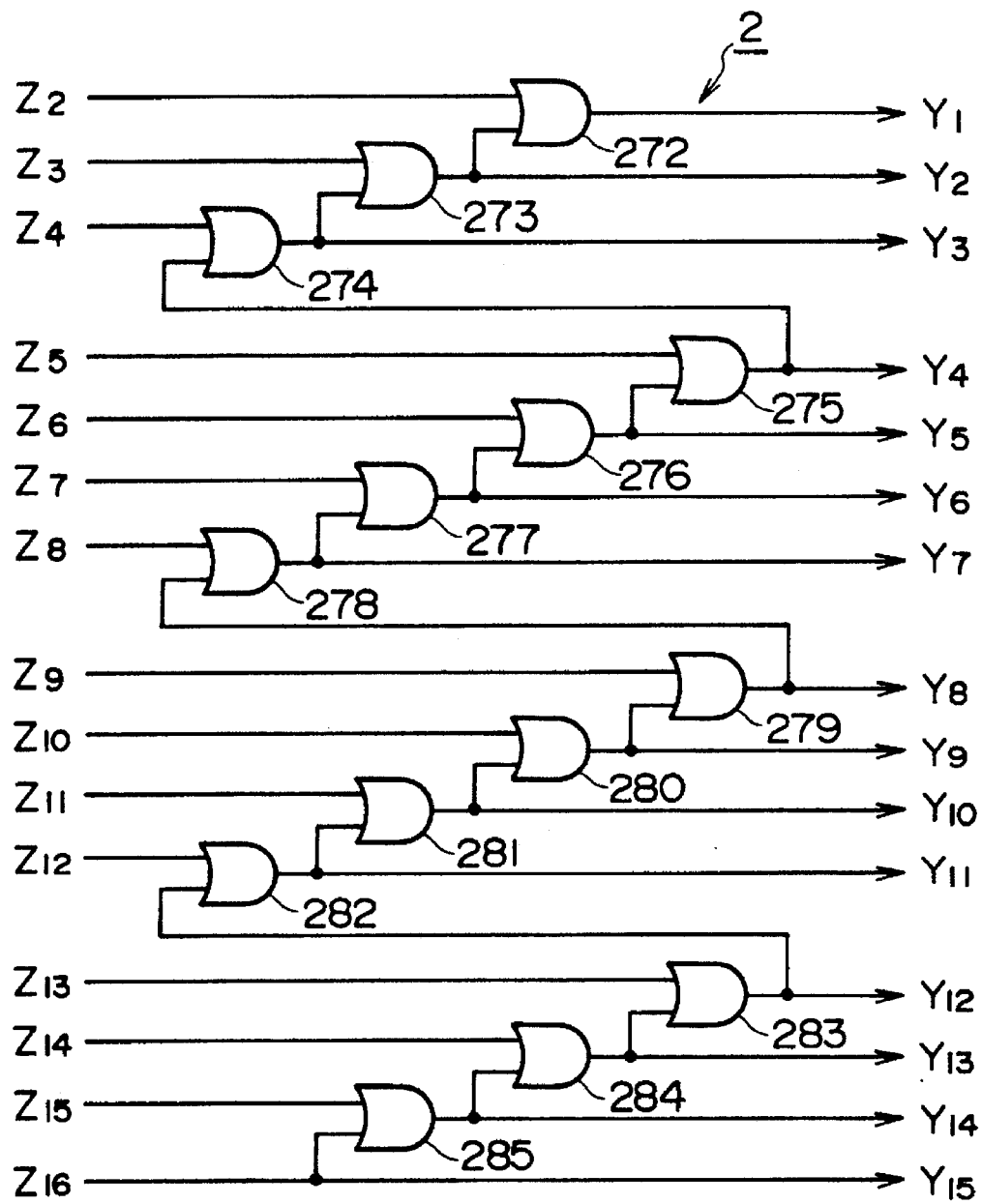
FIG. 3 shows another conventional circuit having a the function similar to that of the second decoder used in the code conversion circuit of FIG. 2, and which comprises a number of OR gates.

FIG. 3 shows another conventional example of decoder 2, in which fourteen OR gates 272–285 are used. OR gates are connected in series, each receiving an output from an associated one of output lines of decoder 1 and a next higher ordered OR gate, as shown. For example, OR gate 272 receives an output from output line $Z_2$ and an output from OR gate 273, and OR gate 284 receives an output on output line $Z_{14}$ of decoder 1 and an output of OR gate 285. OR gate 285 receives outputs on output lines $Z_{15}$ and $Z_{16}$ of decoder 1. The output signal on output line $Z_{18}$ of decoder 1 is also developed as the most significant bit output $Y_{15}$ of decoder 2.

The circuit shown in FIG. 3 operates as follows. Assume, for example, that only the output signal on output line $Z_7$ of decoder 1 is "1" and the remaining outputs are all "0". In this case, none of OR gates 278–285 receives a signal "1" and, therefore, an output "0" is developed on all of output lines $Y_7$ through $Y_{15}$. OR gate 277 receives an signal "1" at its one input and, therefore, develops a output signal "1", which is also applied as an input to OR gate 276. Thus, a signal "1" is applied to OR gates 275, 274, 273 and 272. Accordingly, a signal "1" is developed on each of output lines $Y_1$ through $Y_6$.

As is understood from the above-described examples, many of conventional decoders 2 require a number of transmission gates or OR gates connected in series, which causes unstable operations or reduction in speed, as previously described.

FIG. 4 shows an embodiment of the present invention. A decoder 1 has the same configuration as decoder 1 shown in FIG. 2. Decoder 1 is responsive to a 4-bit binary code signal i applied through input lines $L_1, L_2, L_3$ and $L_4$, and develops an output signal "1" only on the (i+1)-th bit one of sixteen output lines $Z_1$ through $Z_{16}$.

For example, when an input value i is 6, a binary code "0110" is applied to decoder 1, with "1" on lines $L_2$ and $L_3$ and with "0" on lines $L_1$ $L_4$, and a signal "1" is developed on the seventh ((6+1)-th) output line $Z_7$ and a signal "0" is developed on all of the remaining output lines of decoder 1.

Signals on the respective output lines of decoder I are applied to a decoder 2. Decoder 2 is segmented into four blocks 21, 22, 23 and 24. Signals on output lines $Z_1$–$Z_4$ are applied to gates 201–204, respectively, in block 21, signals on output lines $Z_5$–$Z_8$ are applied to gates 205–208, respectively, in block 22, signals on output lines $Z_9$–$Z_{12}$ are applied to gates 209–212, respectively, in block 23, and signals on output lines $Z_{13}$–$Z_{16}$ are applied to gates 213–216, respectively, in block 24.

In block 21, gates 201–204 and an auxiliary gate 221 are connected in series in the named order from a voltage supply to ground. Output lines $Y_1, Y_2, Y_3$ and $Y_4$ are derived from the junction between gates 201 and 202, from the junction between gates 202 and 203, from the junction between gates 203 and 204, and from the junction between gate 204 and auxiliary gate 221, respectively.

In block 22, an auxiliary gate 225, gates 205–208 and an auxiliary gate 222 are connected in series in the named order from the voltage supply to ground. Output lines $Y_5, Y_6, Y_7$ and $Y_8$ are derived from the junction between gates 205 and 206, from the junction between gates 206 and 207, from the junction between gates 207 and 208, and from the junction between gate 208 and auxiliary gate 222, respectively.

Similarly, in block 23, an auxiliary gate 226, gates 209–212 and an auxiliary gate 223 are connected in series in the named order from the voltage supply and ground. Output lines $Y_9, Y_{10}, Y_{11}$ and $Y_{12}$ are derived from the junction between gates 209 and 210, from the junction between gates 210 and 211, from the junction between gates 211 and 212, and from the junction between gate 212 and auxiliary gate 223, respectively.

Block 24 includes an auxiliary gate 227 and gates 213–216 connected in series in the named order from the voltage supply to ground, and output lines $Y_{13}, Y_{14}$ and $Y_{15}$ are derived from the junction between gates 213 and 214, from the junction between gates 214 and 215, and from the junction between gates 215 and 216, respectively.

All of gates 201–216 and auxiliary gates 221, 222, 223, 225, 226 and 227 are enabled when a signal "0" is applied to inputs thereof, and are disabled when a signal "1" is applied to input thereof. Accordingly, in blocks 21–24, when one of the gates or auxiliary gates is disabled upon receiving an input signal "1", a higher potential signal "1" is developed on all of the output lines lower in bit order (i.e. output lines shown in the upper side of that gate in the drawings) than the disabled gate, whereas a lower potential signal "0" is developed on all of the output lines higher in bit order (i.e. output lines shown in the lower side of the disabled gate in the drawings) than the disabled gate.

Auxiliary gates 221, 222, 223, 225, 226 and 227 are controlled by block control signals $C_1, C_2, C_3, \overline{C}_1, \overline{C}_2$ and $\overline{C}_3$, respectively, to determine the states of the blocks to which they belong. Block control signals are prepared by a block control signal generating circuit 3 from the most significant two bits of the binary input on input lines $L_3$ and $L_4$. Signals on $L_3$ and $L_4$ are processed by a NOR gate 31 and a NAND gate 32 of block control signal generating circuit 3 to develop block control signals $\overline{C}_1$ and $\overline{C}_3$ respectively, which are further inverted by inverters 33 and 34 to develop block control signals $C_1$ and $C_3$.

A signal on input line $L_4$ is used for it is as block control signal $C_2$ and further is inverted by an inverter 35 to produce block control signal $\overline{C}_2$. TABLE 1 in FIG. 1 shows the correspondence between the input value i and block control signals $C_1$, $C_2$ and $C_3$.

In FIG. 4, assuming that an input value i of 6 is applied, decoder 1 develops "1" on output line $Z_7$. Since signals on $L_3$ and $L_4$ are "1" and "0" respectively, block control signals $C_1$, $C_2$ and $C_3$ are "1", "0" and "0", respectively.

Due to $\overline{C}_1$="0" and $C_2$="0", auxiliary gates 225 and 222 at the ends of the series connection of gates in block 22 of decoder 2 are both enabled, and gate 207 is disabled by $Z_7$="1". A higher potential signal "1" is developed on less significant bit output lines $Y_5$ and $Y_6$ than gate 207, where a lower potential signal "0" is developed on more significant bit output lines $Y_7$ and $Y_8$.

In block 21 which is lower in order than block 22, since grounded gate 221 is disabled by $C_1$="1", a signal "1" is developed on all of its output lines $Y_1$-$Y_4$. On the other hand, in blocks 23 and 24, which are higher in order than block 22, since voltage supply side auxiliary gates 226 and 227 are disabled by $\overline{C}_2$="1" and $\overline{C}_3$="1", respectively, a lower potential signal "0" is developed on all of output lines $Y_9$-$Y_{15}$.

Thus, the block which receives a signal "1" from decoder 1 is activated by the block control signal applied thereto to operate to allot either a signal "0" or a signal "1" to output lines so that all the blocks lower in order than that block are forced by the block control signals applied thereto to produce a signal "1" on all of their output lines, whereas all the blocks higher in order than that block are forced by the block control signals applied thereto to produce a signal "0" on all of their output lines.

FIGS. 5(a), 5(b) and 5(c) show examples of circuits which may be used as gates 201-216 and auxiliary gates 221-223 and 225-227 shown in FIG. 4, which are transmission gates frequently used in CMOS ICs. Reference number 25 denotes an input terminal, and 26 and 27 denote output terminals. Reference number 28 denotes a P-channel MOS transistor, and 29 denotes an N-channel MOS transistor. Reference number 30 denotes an inverter.

Figure 6:
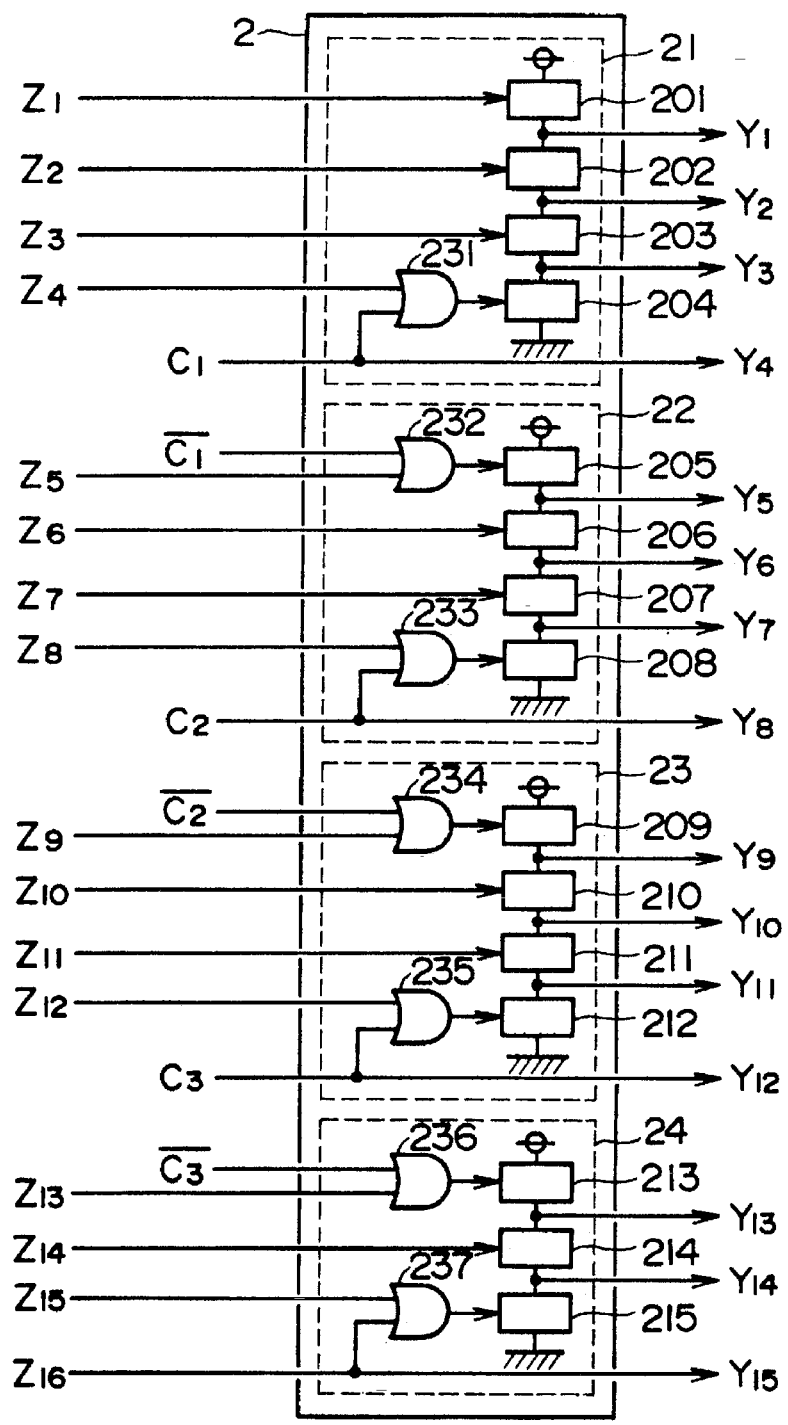
FIG. 6 shows a second decoder used in another example of code conversion circuit according to an embodiment of the present invention, in which the second decoder is segmented into blocks each comprising serially connected transmission gates and an OR gate.

FIG. 6 shows another embodiment of decoder 2 which can be used in the code conversion circuit shown In FIG. 4.

In block 21, gates 201, 202, 203 and 204 are connected in series in the named order from the voltage supply and ground. In a similar manner, in each of blocks 22, 23 and 24, a respective one of series connections of gates 205, 206, 207 and 208, gates 209, 210, 211 and 212, and gates 213, 214 and 215 is connected from the voltage supply and ground. Gates 204, 205, 208, 209, 212, 213 and 215 receive outputs of OR gates 231, 232, 233, 234, 235, 236 and 237, respectively.

Gates 201, 202 and 203 receive signals from output lines $Z_1$, $Z_2$ and $Z_3$ of decoder 1, respectively. Gates 206 and 207 receive signals from output lines $Z_6$ and $Z_7$, respectively. Output signals on lines $Z_{10}$ and $Z_{11}$ are respectively applied to gates 210 and 211. An output signal on line $Z_{14}$ is applied to gate 214. OR gate 231 receives an output from line $Z_4$ and block control signal $C_1$; OR gate 232 receives a block control signal $\overline{C}_1$ and an output from line $Z_5$; OR gate 233 receives an output from line $Z_8$ and block control signal $C_2$; OR gate 234 receives an output from line $Z_9$ and block control signal $\overline{C}_2$; OR gate 235 receives an output from line $Z_{12}$ and block control signal $C_3$; OR gate 236 receives an output from line $Z_{13}$ and block control signal $\overline{C}_3$; and OR gate 237 receives an output from lines $Z_{15}$ and $Z_{16}$.

Output lines $Y_1$, $Y_2$, $Y_3$, $Y_5$, $Y_6$, $Y_7$, $Y_9$, $Y_{10}$, $Y_{11}$, $Y_{13}$ and $Y_{14}$ of decoder 2 are derived from between gates 201 and 202, from between gates 202 and 203, from between gates 203 and 204, from between gates 205 and 206, from between gates 206 and 207, from between gates 207 and 208, from between gates 209 and 210, from between gates 210 and 211, from between gates 211 and 212, from between gates 213 and 214, and from between gates 214 and 215 respectively. Block control signals $C_1$, $C_2$ and $C_3$ are coupled respectively to output lines $Y_4$, $Y_8$ and $Y_{12}$, and output line $Z_{16}$ of decoder 1 is coupled to output line $Y_{15}$.

Referring to FIG. 6, assume that an input value 6 is applied through lines $L_1$, $L_2$, $L_3$ and $L_4$ to decoder 1 (FIG. 4). This causes a signal "1" to be developed on line $Z_7$. Block control signal generating circuit 3 (FIG. 4) provides block control signal $\overline{C}_1$="0" which is applied to OR gate 232. Because an output on line $Z_5$ applied to OR gate 232 is also "0", OR gate 232 produces "0" as an output. Gate 205 is enabled. Similarly because an output on $Z_8$ is "0" and $C_2$="0", gate 208 is also enabled. However, because the output on line $Z_7$ is "1", gate 207 is disabled. Consequently, in block 22, a signal "1" is developed on output lines $Y_5$ and $Y_6$, and an output signal "0" is developed on line $Y_7$. Since $C_2$="0", the signal on output line $Y_8$ is also "0".

In block 21, $C_1$="1" causes a signal "1" to be developed on line $Y_4$. Gate 204 is disabled. Thus, a signal "1" is developed also on lines $Y_1$, $Y_2$ and $Y_3$. In block 23, because $\overline{C}_2$ is "1", gate 209 is disabled, a signal "0" is developed on each of output lines $Y_9$, $Y_{10}$ and $Y_{11}$. Furthermore, since $C_3$ is "0", the signal on output line $Y_{12}$ is also "0". In block 24, because of $\overline{C}_3$ being "1", gate 213 is disabled, and a signal "0" is developed on lines $Y_{13}$ and $Y_{14}$. Since the signal on line $Z_{16}$ is "0", a signal "0" is also developed on line $Y_{15}$.

Thus, the same result as that obtained by decoder 2 of FIG. 4 is obtained from the code conversion circuit employing decoder 2 shown in FIG. 6.

FIG. 7 shows an alternative embodiment of decoder 2 which can be used in the code conversion circuit of FIG. 4. Decoder 2 of FIG. 7 includes OR gates rather than transmission gates.

In block 21, OR gates 240, 241 and 242 receive at one of their respective inputs output signals of decoder 1 (FIG. 4) through lines $Z_2$, $Z_3$ and $Z_4$, respectively. At the other input of respective OR gates 240, 241 and 242, an output of gate 241, an output of gate 242, and block control signal $C_1$ are applied. Outputs of OR gates 240, 241 and 242 are coupled to output lines $Y_1$, $Y_2$ and $Y_3$, respectively. Block control signal $C_1$ is coupled to output line $Y_4$.

Blocks 22 and 23 are constructed similar to block 21, and include OR gates 243, 244 and 245, and OR gates 246, 247 and 248, respectively. Signals on lines $Z_6$, $Z_7$ and $Z_8$ are coupled to a respective input of OR gates 243, 244 and 245 which receive at their respective other input, an output of OR gate 244, an output of OR gate 245, and block control signal $C_2$. Outputs of OR gates 243, 244 and 245 are also coupled to output lines $Y_5$, $Y_8$ and $Y_7$, respectively. Block control signal $C_2$ is coupled to output line $Y_8$. OR gates 246, 247 and 248 receive at their respective one inputs, signals on lines 210, $Z_{11}$ and $Z_{12}$, and receive, at their respective other inputs, an output of OR gate 247, an output of OR gate 248 and block control signal $C_3$. Outputs of OR gates 246, 247 and 248 are coupled to output lines $Y_9$, $Y_{10}$ and $Y_{11}$, respectively. Block control signal $C_3$ is coupled to output line $Y_{12}$.

Block 24 includes OR gates 249 and 250. OR gate 249 receives a signal on line $Z_{14}$ and an output of OR gate 250. OR gate 250 receives signals on lines $Z_{15}$ and $Z_{16}$ at its respective inputs. Outputs of OR gates 249 and 250 are coupled to output lines $Y_{13}$ and $Y_{14}$, respectively. The signal on line $Z_{16}$ is coupled to output line $Y_{15}$.

In FIG. 7, assume that an input value i equal to 6 is applied to decoder 1 (shown in FIG. 4). This causes decoder 1 to develop a signal "1" only on line $Z_7$ and also causes block control signal generating circuit 3 (also shown in FIG. 4) to generate block control signals $C_1$="1", $C_2$="0" and $C_3$="0". Since the output signal "1" on line Z7 is applied to OR gate 244 in block 22, a signal "1" is developed on each of output lines $Y_5$ and $Y_6$, but output lines $Y_7$ and $Y_8$ remain at "0".

Because $C_1$="1" is applied to block 21, a signal "1" is developed on all of output lines $Y_1, Y_2, Y_3$ and $Y_4$. In blocks 23 and 24, since all of input signals including block control signal $C_3$ are "0", an output signal "0" is developed on all of output lines $Y_9$ through $Y_{15}$.

Figure 8:
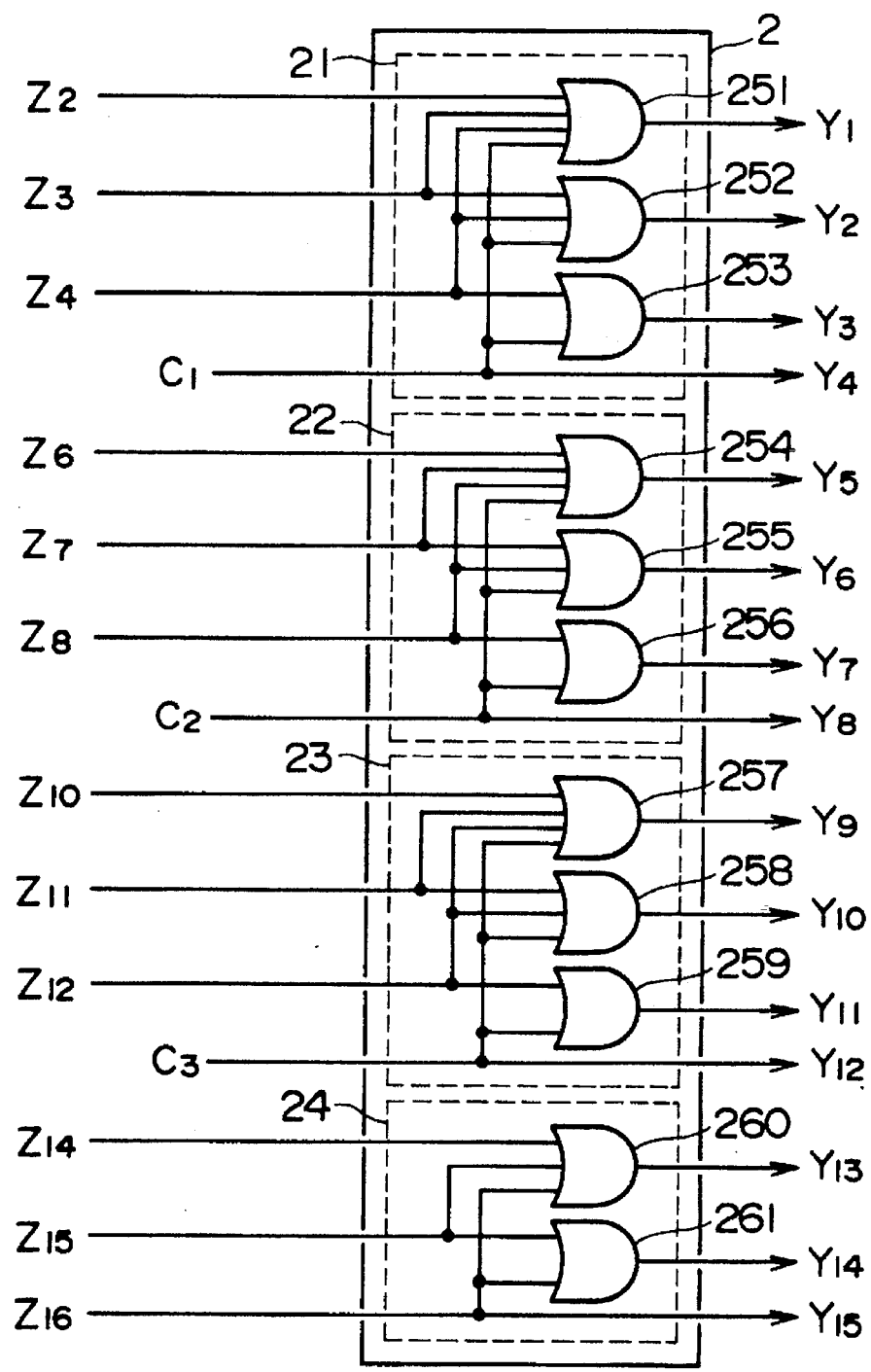
FIG. 8 shows a second decoder used in a fourth example of code conversion circuit according to an embodiment of the present invention, in which the second decoder is segmented into blocks each employing multiple-input OR gates.

FIG. 8 shows a decoder 2 which uses multiple-input OR gates. In block 21, block control signal $C_1$ is coupled to output line $Y_4$ and also to one input of each of OR gates 253, 252 and 251. Line $Z_4$ is coupled to OR gates 253, 252 and 251. Line $Z_3$ is coupled to OR gate 252 and 251, and line Z2 is coupled to OR gate 251. Outputs of OR gates 251, 252 and 253 are coupled to output lines $Y_1, Y_2$ and $Y_3$ respectively.

Blocks 22 and 23 have a similar configuration to block 21. Block 22 includes OR gates 254, 255 and 256 to which lines $Z_6, Z_7$ and $Z_8$ are respectively coupled. Block control signal $C_2$ is coupled to all of OR gates 254, 255 and 256 as well as to output line $Y_8$. Line $Z_7$ is also coupled to OR gate 254, and line $Z_8$ is also coupled to OR gates 254 and 255. Outputs of OR gates 254, 255 and 256 are coupled to output lines $Y_5$, $Y_6$ and $Y_7$ respectively.

Block 23 includes OR gates 257, 258 and 259 to which lines $Z_{10}, Z_{11}$ and $Z_{12}$ are respectively coupled. Block control signal $C_3$ is coupled to all of OR gates 257, 258 and 259 as well as to output line $Y_{12}$. Line $Z_{11}$ is also coupled to OR gate 257, and line $Z_{12}$ is also coupled to OR gates 257 and 258. Outputs of OR gates 257, 258 and 259 are coupled to output lines $Y_9, Y_{10}$ and $Y_{11}$ respectively.

Block 24 includes two OR gates 260 and 261 to which lines $Z_{14}$ and $Z_{15}$ are respectively coupled. Line $Z_{15}$ is also coupled to an input of OR gate 260. Line $Z_{16}$ is coupled to OR gates 260 and 261 and also to output line $Y_{15}$. Output lines $Y_{13}$ and $Y_{14}$ are derived from the outputs of OR gates 260 and 261, respectively.

The code conversion circuit employing decoder 2 shown in FIG. 8 operates in a similar manner to the circuit employing the decoder shown In FIG. 7.

Figure 9:
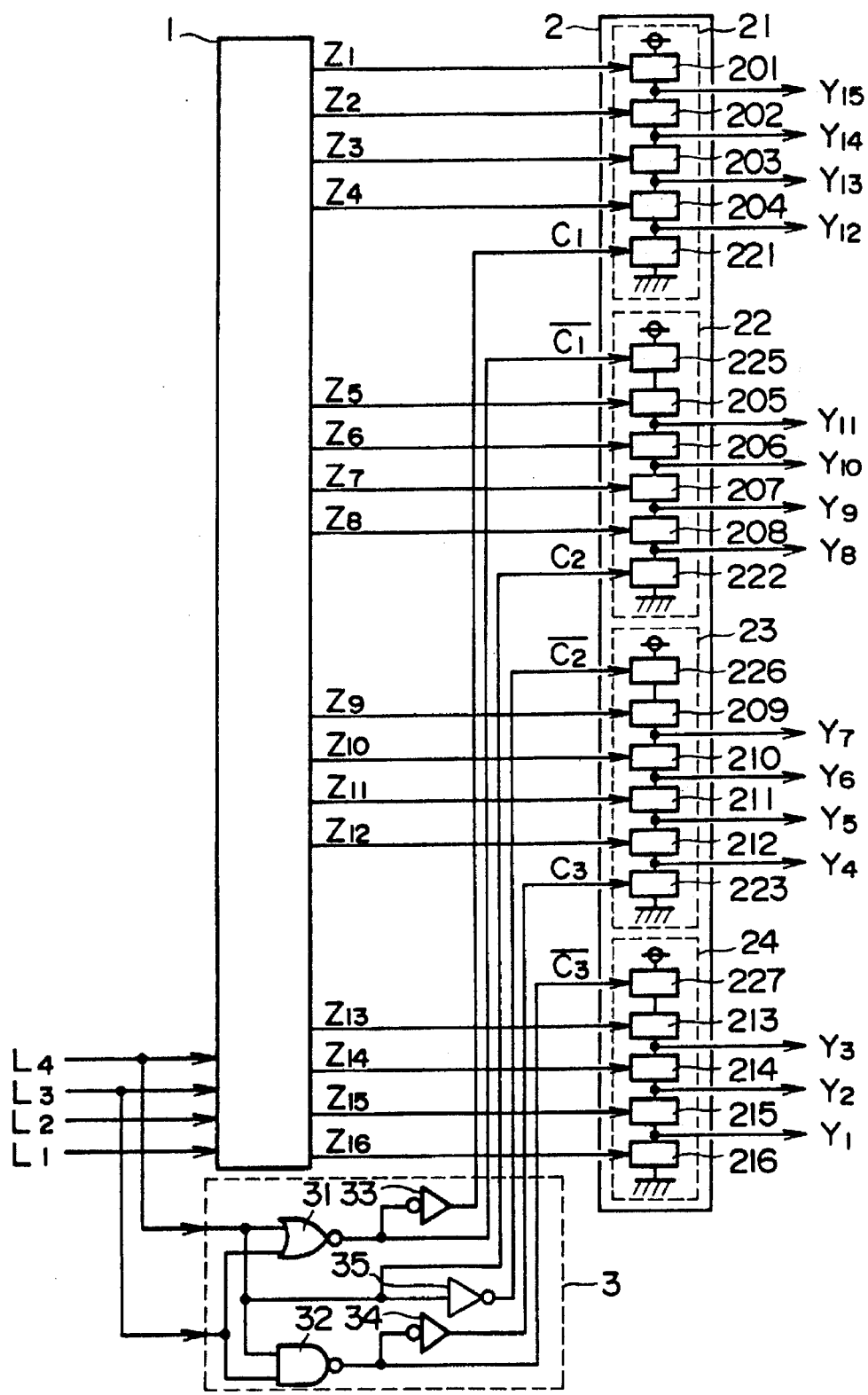
FIG. 9 shows a code conversion circuit according to an embodiment of the present invention, in which output lines of the second decoder are ordinally numbered in the reverse direction relative to the embodiments shown in FIGS. 4–8.

FIG. 9 shows a code conversion circuit of a second type according to the present invention. The relationship between an input value i and the circuit outputs is as shown in TABLE 2 of FIG. 10. As is shown in FIG. 10, when an input value i is applied to a decoder 1 through input lines $L_1$ through $L_4$, a signal "1" is developed on the decoder output line (i–1)-th from the most significant bit output line and on output lines higher in order than that. In other words, when an input value i is applied to decoder 1 in the binary form, a signal "1" is developed on the i most significant bit output lines of decoder 2. On the remaining output lines, a signal "0" is developed.

The configuration of the code conversion circuit shown in FIG. 9 is quite the same as that of the code conversion circuit shown in FIG. 4, except that output lines are derived from different locations than in FIG. 4. For example, the most significant bit output line $Y_{15}$ is derived from between gates 201 and 202, rather than from between gates 215 and 216, and the least significant bit output line $Y_1$ is derived from between gates 215 and 216 rather than from between gates 201 and 202. Specifically, output lines $Y_{15}, Y_{14}, Y_{13}$ and $Y_{12}$ are derived from between gates 201 and 202, from between gates 202 and 203, from between gates 203 and 204, and from between gate 204 and auxiliary gate 221 respectively; output lines $Y_{11}, Y_{10}, Y_9$ and $Y_8$ are derived from between gates 205 and 206, from between gates 206 and 207, from between gates 207 and 208, and from between gate 208 and auxiliary gate 222 respectively; output lines $Y_7, Y_6, Y_5$ and $Y_4$ are derived from between gates 209 and 210, from between gates 210 and 211, from between gates 211 and 212, and from gate 212 and auxiliary gate 223 respectively; and output lines $Y_3, Y_2$ and $Y_1$ are derived from between gates 213 and 214, from between gates 214 and 215, and from between gates 215 and 216 respectively.

In operation, let it be assumed that an input value of 6 is applied to decoder 1. Decoder 1 develops a signal "1" only on its output line $Z_7$, and block control signal generating circuit 3 generates block control signals $C_1$="1", $C_2$="0" and $C_3$="0".

Because of $\overline{C}_1$="0" and $C_2$="0", auxiliary gates 222 and 225 of block 22 are enabled, whereas gate 207 is disabled by the signal "1" on line $Z_7$. Thus, a high level signal "1" is developed on output lines $Y_{10}$ and $Y_{11}$, and a low level signal "0" is developed on output lines $Y_8$ and $Y_9$.

In block 21, grounded gate 221 is disabled so that a high level signal "1" is developed on all of output lines $Y_{12}$–$Y_{15}$. In blocks 23 and 24, because to $\overline{C}_2$="1" and $\overline{C}_3$="1, auxiliary gates 226 and 227 coupled to the voltage supply are disabled, whereby a low level signal "0" is developed on all of output lines $Y_4$–$Y_7$ and all of output lines $Y_1$–$Y_3$.

Thus, as shown TABLE 2 in FIG. 10, an output signal "1" is developed on the output line $Y_{10}$ fifth (i.e. (6–1)-th) from the most significant bit output line $Y_{15}$ and also on all of the higher order output lines $Y_{11}$–$Y_{15}$. (In other words, a signal "1" is developed on each of the six most significant bit output lines $Y_{10}$–$Y_{15}$.) On all of the output lines $Y_9$–$Y_1$ lower in bit order than output line $Y_{10}$, a signal "0" is developed.

Reviewing the circuit shown in FIG. 9, it is seen that the circuit structure is the same as that of the circuit shown in FIG. 4, except that the numbering of the output lines from decoder 2 is opposite to each other. That is, in the circuit of FIG. 4, the less significant bit output side of decoder 2 is on the same side as the less significant bit output side of decoder 1, where the less significant bit output side of decoder 2 is on the more significant bit output side of decoder 1 in FIG. 9. Thus, there is no essential difference in operation between the circuits shown in FIGS. 4 and 9.

The present invention has been described in terms of circuits in which an input value i is applied in a four-bit binary code format, and decoder 2 is divided into four blocks. It should be noted, however, that the number of input bits and the number of blocks is optional. Block control signals, such as $C_1, C_2, C_3$ . . . , for controlling respective blocks of decoder 2 are prepared from the most significant bit of the input value i when the number of blocks is two, from the two most significant bits for four blocks as described above, from the three most significant bits for eight blocks, and from the four most significant bits for sixteen blocks.

FIG. 11 shows an embodiment of a circuit arrangement of block control signal generating circuit 3 for segmenting decoder 2 into two blocks. The most significant bit $L_4$ of the binary input is used as it is as a block control signal $C_1$, and its inverted version $\overline{C}_1$ prepared by an inverter 36 is used as another block control signal.

FIG. 12 shows an embodiment of block control signal generating circuit 3 for use with decoder 2 segmented into eight blocks. The most significant bit $L_a$ is applied to a NOR gate 41, a NOR gate 42, the NOR section of an AND-NOR gate 43, an inverter 44, the NAND section of an OR-NAND gate 45, a NAND gate 46, and a NAND gate 47. The second significant bit $L_{a-1}$ is applied to NOR gate 41, NOR gate 42, the AND section of AND-NOR gate 43, the OR section of OR-NAND gate 45, NAND gate 46 and NAND gate 47. The bit $L_{a-2}$ is applied to NOR gate 41, the AND section of AND-NOR gate 43, the OR section of OR-NAND gate 45, and NAND gate 47.

Outputs from gates 41, 42, 43, 44, 45, 46 and 47 are block control signals $\overline{C}_1$, $\overline{C}_2$, $\overline{C}_3$, $\overline{C}_4$, $\overline{C}_5$, $\overline{C}_6$ and $\overline{C}_7$ respectively. These block control signals are inverted by inverters 51, 52, 53, 54, 55, 56 and 57 to produce block control signals $C_1$, $C_2$, $C_3$, $C_4$, $C_5$, $C_6$ and $C_7$.

FIG. 13 is block control signal generating circuit 3 for use with a decoder 2 segmented into sixteen blocks. The second significant bit signal $L_{a-1}$ is applied to NOR gates 51, 61, NOR gates 52, 62, the NOR sections of AND-NOR gates 53, 63, inverters 54, 64, the NAND sections of OR-NAND gates 55, 65, NAND gates 56, 66, and NAND gates 57, 67. The third significant bit signal $L_{a-2}$ is applied to NOR gates 51, 61, NOR gates 52, 62, the AND sections of AND-NOR gates 53, 63, the OR sections of OR-NAND gates 55, 65, NAND gates 56, 66, and NAND gates 57, 67. The fourth significant bit signal $L_{a-3}$ is applied to NOR gates 51, 61, the AND sections of AND-NOR gates 53, 63, the OR sections of OR-NAND gates 55, 65, and NAND gates 57, 67.

The arrangements of the group of gates 51–57 and the group of gates 61–67, and the connection of inputs $L_{a-1}$, $L_{a-2}$ and $L_{a-3}$ to the gates groups are the same as the arrangements of gates 41–47 and the connections of inputs $L_a$, $L_{a-1}$, and $L_{a-2}$ to gates 41–47 shown in FIG. 12.

Output from gates 51–57 are applied to NAND gates 71–77, respectively, and output from gates 61–67 are applied to NOR gates 81–87. NAND gates 71–77 and NOR gates 81–87 also receive the most significant bit signal $L_a$ after it is inverted by an inverter 68. NAND gates 71–77 produce block control signals $C_1$–$C_7$, and NOR gates 81–87 produce block control signals $C_9$–$C_{15}$. As a block control signal $C_8$, the most significant bit signal $L_a$ may be used as it is, or a signal prepared by inverting the inverted version of $L_a$ from inverter 68 may be used.

As described in detail above, according to the present invention, gates are divided into a plurality of blocks which are operated in parallel, so that the number of gates connected in series is reduced relative to conventional circuits. Accordingly, the circuit can operate with stability and at a higher operating speed.

What is claimed is:

1. A code conversion circuit, comprising:

a first decoder including means for receiving an a-bit binary input representing a value i, where i is an integer≧0;

said first decoder including b first output lines being ordinally numbered, where $b \leq 2^a$;

said first decoder further including means responsive to said a-bit binary input for producing a plurality of first output signals on said b first output lines;

said plurality of first output signals including a signal "1" only on an (i+1)th one of said b first output lines and a signal "0" on a remainder of said b first output lines;

a second decoder including means for receiving said first output signals;

said second decoder including a plurality of second output lines being ordinally numbered;

said second decoder further including means responsive to said plurality of first output signals for producing a plurality of second output signals;

said plurality of second output signals including a signal "1" on a second output line i-th from a first end of said plurality of second output lines and on each of said plurality of second output lines from said second output line i-th from said first end to a one of said second output lines located at said first end, and a signal "0" on a remainder of said second output lines;

said second decoder being segmented into a plurality of blocks, each of said plurality of blocks including a different set of ordinally numbered ones of said second output lines;

said plurality of blocks being ordered from a lowest ordered block to a highest ordered block;

said lowest ordered block including said first end of said plurality of second output lines;

each of said plurality of blocks including state determining means for selectively placing an associated one of said plurality of blocks in one of a first state, a second state and a third state;

said first state wherein a signal "1" is developed on all of said plurality of second output lines included in said associated one of said plurality of blocks;

said second state wherein a signal "1" is developed on a second output line i-th from said first end of said plurality of second output lines and all of said second output lines nearer to said first end which are included in said associated one of said plurality of blocks, and a signal "0" is developed on a remainder of said plurality of second output lines included in said associated one of said plurality of blocks;

said third state wherein a signal "0" is developed on all of said plurality of second output lines included in said associated one of said plurality of blocks;

block control signal generating means responsive to said a-bit binary input for producing and supplying block control signals including means for controlling respective ones of said state determining means in each of said plurality of blocks;

said block control signals each being one of a first, a second and a third block control signal to place a respective block in one of said first state, said second state and said third state respectively;

said block control signal generating means including means for supplying said second block control signal to said state determining means in an n-th block of said plurality of blocks to which said second output line i-th from said first end belongs;

said block control signal generating means including means for supplying said first block control signal to said state determining means in each of a first to a (n−1)th block of said plurality of blocks; and said block control signal generating means including means for supplying said third block control signal to said state determining means in each of a (n+1)th and higher order blocks of said plurality of blocks.

2. The code conversion circuit according to claim 1 wherein said second decoder is segmented into a number of blocks equal to a power of 2.

3. The code conversion circuit according to claim 1 wherein:

said second decoder is segmented into $2^c$ blocks, where c is a positive integer; and said block control signals are prepared by said block control signal generating means based on the c most significant bits of said binary input.

4. The code conversion circuit according to claim 1 wherein:

each of said plurality of blocks includes a series combination of transmission gates connected between a voltage supply at a first end thereof and a point of reference potential at a second end thereof;

said state determining means in said lowest order block and said highest order block include a transmission gate at one of said first end and said second end of said series combination, and in a remainder of said plurality of blocks includes said transmission gate at said first end and at said second end of said series combination;

corresponding ones of said b first output lines of said first decoder being connected to a remainder of transmission gates of each of said plurality of blocks;

each of said transmission gates having a first end towards said voltage supply and a second end towards said point of reference potential; and said second output lines of said second decoder belonging to each of said plurality of blocks being derived from said second ends of each transmission gate except for those transmission gates directly receiving said block control signals and except for said transmission gate in said highest ordered block connected directly to said point of reference potential.

5. The code conversion circuit according to claim 1 wherein:

each of said plurality of blocks includes a series combination of ordinally numbered transmission gates connected between a voltage supply at a first end thereof and a point of reference potential at a second end thereof;

at least one of said transmission gates at said first end and said second end of said series combination of each block being coupled to an output of an associated OR gate to which an output on a respective one of said b first output lines of said first decoder corresponding in ordinal number to the transmission gate associated with said OR gate and a block control signal are coupled;

a remainder of transmission gates in each of said plurality of blocks being supplied with first output signals on said b first output lines of said first decoder corresponding in ordinal number to the respective ones of said remaining transmission gates;

a highest ordered one of said second output lines in each block, except said highest ordered block, being derived from said block control signal which is coupled to said OR gate which is coupled to said highest ordered transmission gate within said each block except for said highest ordered block;

a highest ordered one of said second output lines of said highest ordered block being derived from said highest ordered first output line; and a remainder of said second output lines of said second decoder belonging to each of said plurality of blocks being derived from between adjacent ones of said transmission gates.

6. The code conversion circuit according to claim 1 wherein:

each of said plurality of blocks includes a series combination of ordinally numbered transmission gates connected between a voltage supply at a first end thereof and a point of reference potential at a second end thereof;

at least one of said transmission gates at said first end and said second end of said series combination of each block being coupled to an output of an associated OR gate to which an output on a respective one of said b first output lines of said first decoder corresponding in ordinal number to the transmission gate associated with said OR gate and a block control signal are coupled;

a remainder of transmission gates in each of said plurality of blocks being supplied with first output signals on said b first output lines of said first decoder corresponding in ordinal number to the respective ones of said remaining transmission gates;

a lowest ordered one of said second output lines in each block, except said highest ordered block, being derived from said block control signal which is coupled to said OR gate which is coupled to said highest ordered transmission gate within said each block except for said highest ordered block;

a lowest ordered one of said second output lines of said highest ordered block being derived from said highest ordered first output line; and a remainder of said second output lines of said second decoder belonging to each of said plurality of blocks being derived from between adjacent ones of said transmission gates.

7. The code conversion circuit according to claim 1 wherein:

each of said plurality of blocks includes a plurality of ordinally numbered OR gates;

each highest ordered OR gate in each of said plurality of blocks, except for said highest ordered block, receiving a block control signal and a respective first output line;

a highest ordered OR gate in said highest ordered block receiving said highest ordered first output line and said next highest ordered first output line;

each of a remainder of OR gates in each of said plurality of blocks receiving one of said first output signals on said b first output lines of said first decoder corresponding in ordinal number to said OR gate and an output of an ordinally higher adjacent OR gate;

a highest ordered one of said second output lines in each block, except said highest ordered block, being derived from said block control signal which is coupled to said highest ordered OR gate within each block except for said highest ordered block;

a highest ordered one of said second output lines of said highest ordered block being derived from said highest ordered first output line; and a remainder of said second output lines belonging to each of said plurality of blocks being derived from each respective OR gate contained within said each of said plurality of blocks.

8. The code conversion circuit according to claim 1 wherein:

each of said plurality of blocks includes a plurality of ordinally numbered OR gates;

each highest ordered OR gate in each of said plurality of blocks, except for said highest ordered block, receiving a block control signal and a respective first output line;

a highest ordered OR gate in said highest ordered block receiving said highest ordered first output line and said next highest ordered first output line;

each of a remainder of OR gates in each of said plurality of blocks receiving one of said first output signals on said b first output lines of said first decoder corresponding in ordinal number to said OR gate and an output of an ordinally higher adjacent OR gate;

a lowest ordered one of said second output lines in each block, except said highest ordered block, being derived from said block control signal which is coupled to said highest ordered OR gate within each block except for said highest ordered block;

a lowest ordered one of said second output lines of said highest ordered block being derived from said highest ordered first output line; and a remainder of said second output lines belonging to each of said plurality of blocks being derived from each respective OR gate contained within said each of said plurality of blocks.

9. The code conversion circuit according to claim 1 wherein:

each of said plurality of blocks includes a plurality of ordinally numbered OR gates;

each highest ordered OR gate in each of said plurality of blocks, except for said highest ordered block, receiving a block control signal and a respective first output line;

a highest ordered OR gate in said highest ordered block receiving said highest ordered first output line and said next highest ordered first output line;

each of a remainder of OR gates in each of said plurality of blocks receiving a respective one of said first output lines and all first output lines received by all higher ordered OR gates within said each of said plurality of blocks;

a highest ordered one of said second output lines in each block, except said highest ordered block, being derived from said block control signal which is received within said each block, except for said highest ordered block;

a highest ordered one of said second output lines of said highest ordered block being derived from said highest ordered first output line; and a remainder of said second output lines belonging to each of said plurality of blocks being derived from each respective OR gate contained within said each of said plurality of blocks.

10. The code conversion circuit according to claim 1 wherein:

each of said plurality of blocks includes a plurality of ordinally numbered OR gates;

each highest ordered OR gate in each of said plurality of blocks, except for said highest ordered block, receiving a block control signal and a respective first output line;

a highest ordered OR gate in said highest ordered block receiving said highest ordered first output line and said next highest ordered first output line;

each of a remainder of OR gates in each of said plurality of blocks receiving a respective one of said first output lines and all first output lines received by all higher ordered OR gates within said each of said plurality of blocks;

a lowest ordered one of said second output lines in each block, except said highest ordered block, being derived from said block control signal which is received within said each block, except for said highest ordered block;

a lowest ordered one of said second output lines of said highest ordered block being derived from said highest ordered first output line; and a remainder of said second output lines belonging to each of said plurality of blocks being derived from each respective OR gate contained within said each of said plurality of blocks.

11. A code conversion circuit, comprising:

a first decoder including means for receiving a p-bit binary input on p binary input lines being ordinally numbered $L_1$ through $L_p$;

said p-bit binary input representing a value i, where i is an integer $\geq 0$;

said first decoder including q first output lines being ordinally numbered $Z_1$ through $Z_q$, where q is a positive integer and $q \geq 2^p$;

said first decoder further including means responsive to said p-bit binary input for producing a plurality of first output signals on said q first output lines;

said plurality of first output signals including a signal "1" only on first output line $Z_{i+1}$ and a signal "0" on first output lines $Z_1$ to $Z_i$ and $Z_{i+2}$ to $Z_q$;

a second decoder including means for receiving said first output signals;

said second decoder including a plurality of second output lines being ordinally numbered $Y_1$ through $Y_j$, where j is a positive integer and $j \leq q-1$;

said second decoder further including means responsive to said first output signals for producing a plurality of second output signals on said second output lines;

said plurality of second output signals including a signal "1" on second output lines $Y_1$ to $Y_i$ and a signal "0" on second output lines $Y_{i+1}$ to $Y_j$;

said second decoder being segmented into a plurality of blocks, each of said blocks including a set of different ordinally numbered ones of said second output lines and receiving a set of different ordinally numbered first output lines;

said plurality of blocks being ordinally numbered from a lowest ordered block $B_1$ to a highest ordered block $B_r$, and including a block $B_n$ where r and n are positive integers and $1 \leq n \leq r$;

said block $B_1$ receiving first output line $Z_1$ and including said second output line $Y_1$;

said block $B_n$ receiving first output line $Z_{i+1}$ and including second output line $Y_i$;

means for controlling a state of each of said blocks whereby each of said blocks is in one of a first state, a second state and a third state;

said first state wherein a signal "1" is developed on each of said second output lines included in said block;

said second state wherein a signal "1" is developed on second output line $Y_i$ and all of a group of less significant second output lines which are included in said block, and a signal "0" is developed on a group of more significant second output lines included in said block;

said third state wherein a signal "0" is developed on each of said second output lines included in said block;

means for generating a plurality of block control signals responsive to said p-bit binary input; and said state controlling means being responsive to said block control signals whereby said block $B_n$ is placed in said second state, more significant blocks are placed in said third state, and less significant blocks are placed in said first state.

12. The code conversion circuit according to claim 11 wherein:

$r=2^c$, where c is a positive integer;

said block control signal generating means are responsive to the c most significant bits of said p-bit binary input; and said block control signals are ordinally numbered and include $C_1$ to $C_{r-1}$ and $\overline{C}_1$ to $\overline{C}_{r-1}$, where each block control signal $\overline{C}_1$ to $\overline{C}_{r-1}$ is the inverse of each corresponding block control signal $C_1$ to $C_{r-1}$, respectively.

13. The code conversion circuit according to claim 11, wherein:

each of said blocks includes a plurality of transmission gates in series between a voltage supply at a first end and a reference potential at a second end;

each of said transmission gates includes a first end and a second end;

each transmission gate first end is connected in series to one of an adjacent transmission gate and said voltage supply;

each transmission gate second end is connected in series to one of an adjacent transmission gate and said reference potential;

said state controlling means in said block $B_1$ includes a one of said plurality of transmission gates nearest said reference potential;

said state controlling means in said block $B_r$ includes a one of said plurality of transmission gates nearest said voltage supply;

said state controlling means in each block $B_k$ includes a one of said plurality of transmission gates nearest said voltage supply and a one of said plurality of transmission gates nearest said reference potential, where k is a positive integer and $2 \leq k \leq r-1$;

a remainder of said plurality of transmission gates is ordinally numbered from $G_1$ to $G_q$ and said transmission gate $G_1$ is in said block $B_1$ and is nearest to said voltage supply;

each of said transmission gates $G_1$ to $G_q$ receive as inputs said plurality of first output signals on first output lines $Z_1$ to $Z_q$ respectively; and each of said second output lines $Y_1$ to $Y_j$ is derived from said second end of transmission gates $G_1$ to $G_j$ respectively.

14. The code conversion circuit according to claim 12, wherein:

each of said blocks includes a plurality of transmission gates in series between a voltage supply at a first end and a reference potential at a second end;

each of said transmission gates includes a first end and a second end;

each transmission gate first end is connected in series to one of an adjacent transmission gate and said voltage supply;

each transmission gate second end is connected in series to one of an adjacent transmission gate and said reference potential;

each of said transmission gates is ordinally numbered from $G_1$ to $G_j$;

said transmission gate $G_1$ is in said block $B_1$ and is nearest to said voltage supply;

said state controlling means in said block $B_1$ includes an OR gate coupled to a transmission gate nearest said reference potential;

said state controlling means in each block $B_m$ includes a first OR gate coupled to a transmission gate nearest said voltage supply and a second OR gate coupled to a transmission gate nearest said reference potential, where m is a positive integer and $2 \leq m \leq r$;

said block $B_1$ OR gate receives as inputs block control signal $C_1$ and a first output signal on a most significant first output line received in said block $B_1$;

each block $B_m$ first OR gate receives as inputs block control signal $\overline{C}_{m-1}$ and a first output signal on a least significant first output line received in said block $B_m$;

each block $B_k$ second OR gate receives as inputs block control signal $C_k$ and a first output signal on a most significant first output line received in said block $B_k$, where k is a positive integer and $2 \leq k \leq r-1$;

said block $B_r$ second OR gate receives as inputs two first output signals on two most significant first output lines received in said block $B_r$;

each of a remainder of transmission gates not receiving an input from an OR gate is coupled to a respective first output line having an identical ordinal number;

a highest order one of said second output lines in each block $B_s$ is derived from a respective block control signal $C_s$, where s is a positive integer and $1 \leq s \leq r-1$;

said second output line $Y_j$ is derived from said first output line $Z_q$; and each of a remainder of second output lines is derived from said transmission gate second end of a remainder of respective transmission gates having an identical ordinal number.

15. A code conversion circuit, comprising:

a first decoder including means for receiving a p-bit binary input on p binary input lines being ordinally numbered $L_1$ through $L_p$;

said p-bit binary input representing a value i, where i is an integer $\geq 0$;

said first decoder including q first output lines being ordinally numbered $Z_1$ through $Z_q$, where $q \leq 2^p$;

said first decoder further including means responsive to said p-bit binary input for producing a plurality of first output signals on said q first output lines;

said plurality of first output signals including a signal "1" only on first output line $Z_{i+1}$ and a signal "0" on first output lines $Z_1$ to $Z_i$ and $Z_{i+2}$ to $Z_q$;

a second decoder including means for receiving said first output signals;

said second decoder including a plurality of second output lines being ordinally numbered $Y_1$ through $Y_j$, where $j \leq q-1$;

said second decoder further including means responsive to said first output signals for producing a plurality of second output signals on said second output lines;

said plurality of second output signals including a signal "0" on second output lines $Y_1$ to $Y_{j-i}$ and a signal "1" on second output lines $Y_{j-i+1}$ to $Y_j$;

said second decoder being segmented into a plurality of blocks, each of said blocks including a set of different ordinally numbered ones of said second output lines;

said plurality of blocks being ordinally numbered from a lowest ordered block $B_1$ to a highest ordered block $B_r$ and including a block $B_n$ where r is a positive integer and $1 \leq n \leq r$; said block $B_1$ receiving first output line $Z_1$ and including said second output line $Y_j$;

said block $B_n$ receiving first output line $Z_{i+1}$ and including second output line $Y_{j-i+1}$;

means for controlling a state of each of said blocks whereby each of said blocks is in one of a first state, a second state and a third state;

said first state wherein a signal "1" is developed on each of said second output lines included in said block;

said second state wherein a signal "1" is developed on second output line $Y_{j\text{-}i+1}$ and all of a group of more significant second output lines which are included in said block, and a signal "0" is developed on a group of less significant second output lines included in said block;

said third state wherein a signal "0" is developed on each of said second output lines included in said block;

means for generating a block control signal responsive to said p-bit binary input; and said state controlling means being responsive to said block control signal generating means whereby said block $B_n$ is placed in said second state, more significant blocks are placed in said third state, and less significant blocks are placed in said first state.

* * * * *